United States Patent
Hoshino et al.

(10) Patent No.: US 11,921,308 B2
(45) Date of Patent: Mar. 5, 2024

(54) POLARIZER AND IMAGE DISPLAY DEVICE

(71) Applicant: FUJIFILM Corporation, Tokyo (JP)

(72) Inventors: Wataru Hoshino, Kanagawa (JP); Yuya Hamaguchi, Kanagawa (JP)

(73) Assignee: FUJIFILM Corporation, Tokyo (JP)

(*) Notice: Subject to any disclaimer, the term of this patent is extended or adjusted under 35 U.S.C. 154(b) by 335 days.

(21) Appl. No.: 16/950,202

(22) Filed: Nov. 17, 2020

(65) Prior Publication Data

US 2021/0072443 A1 Mar. 11, 2021

Related U.S. Application Data

(63) Continuation of application No. PCT/JP2019/019481, filed on May 16, 2019.

(30) Foreign Application Priority Data

May 25, 2018 (JP) .................................. 2018-100563

(51) Int. Cl.
| | |
|---|---|
| G02B 5/30 | (2006.01) |
| C09K 19/20 | (2006.01) |
| C09K 19/60 | (2006.01) |
| G02F 1/1335 | (2006.01) |
| H10K 50/86 | (2023.01) |

(52) U.S. Cl.
CPC ........ G02B 5/3016 (2013.01); C09K 19/2007 (2013.01); C09K 19/601 (2013.01); G02F 1/133528 (2013.01); H10K 50/865 (2023.02)

(58) Field of Classification Search
CPC .......................... G02B 5/3016; C09K 19/2007; C09K 19/601; G02F 1/133528; H01L 51/5284
USPC ...................................................... 349/96–98
See application file for complete search history.

(56) References Cited

U.S. PATENT DOCUMENTS

| | | | |
|---|---|---|---|
| 2015/0362799 A1* | 12/2015 | Kim ..................... | G02B 5/3016 349/96 |
| 2016/0291224 A1 | 10/2016 | Ahn et al. | |
| 2017/0242297 A1* | 8/2017 | Moon ............... | G02F 1/133533 |
| 2017/0306237 A1 | 10/2017 | Morimoto et al. | |
| 2018/0346633 A1 | 12/2018 | Hoshino et al. | |
| 2019/0071571 A1 | 3/2019 | Takada et al. | |
| 2019/0072700 A1* | 3/2019 | Lee ....................... | G02B 5/3033 |
| 2020/0018879 A1* | 1/2020 | Katou .................. | C09K 19/408 |
| 2020/0319507 A1 | 10/2020 | Matsuyama et al. | |
| 2021/0026195 A1 | 1/2021 | Kuwayama et al. | |
| 2021/0055604 A1 | 2/2021 | Hoshino et al. | |

FOREIGN PATENT DOCUMENTS

| | | |
|---|---|---|
| CN | 103360787 A | 10/2013 |
| JP | 2013-109090 A | 6/2013 |
| JP | 2017-197630 A | 11/2017 |
| WO | 2009/051002 A1 | 4/2009 |
| WO | 2017/154907 A1 | 9/2017 |
| WO | 2017/195833 A1 | 11/2017 |
| WO | 2018/186503 A1 | 10/2018 |
| WO | 2019/132020 A1 | 7/2019 |
| WO | 2019/189345 A1 | 10/2019 |
| WO | 2019/203192 A1 | 10/2019 |

OTHER PUBLICATIONS

Office Action, issued by the State Intellectual Property Office dated Dec. 7, 2021, in connection with Chinese Patent Application No. 201980034862.7.
Office Action, issued by the Japanese Patent Office dated Aug. 24, 2021, in connection with Japanese Patent Application No. 2020-521191.
Office Action, issued by the State Intellectual Property Office dated Apr. 1, 2022, in connection with Chinese Patent Application No. 201980034862.7.
International Search Report issued in PCT/JP2019/019481 dated Aug. 6, 2019.
Written Opinion issued in PCT/JP2019/019481 dated Aug. 6, 2019.
International Preliminary Report on Patentability completed by WIPO dated Dec. 1, 2020 in connection with International Patent Application No. PCT/JP2019/019481.

* cited by examiner

*Primary Examiner* — Charles S Chang
(74) *Attorney, Agent, or Firm* — Edwards Neils LLC; Jean C. Edwards, Esq.

(57) ABSTRACT

An object of the present invention is to provide a polarizer with a high degree of alignment and an image display device including the polarizer. The polarizer of the present invention is a polarizer which is formed of a polarizer-forming composition containing a liquid crystal compound, a first dichroic material, and a second dichroic material, in which the first dichroic material and the second dichroic material are aligned horizontally with respect to a surface of the polarizer, the first dichroic material is a compound compatible with the liquid crystal compound, and the second dichroic material is a compound which is not compatible with the liquid crystal compound.

18 Claims, No Drawings

POLARIZER AND IMAGE DISPLAY DEVICE

CROSS-REFERENCE TO RELATED APPLICATIONS

This application is a Continuation of PCT International Application No. PCT/JP2019/019481 filed on May 16, 2019, which was published under PCT Article 21(2) in Japanese, and which claims priority under 35 U.S.C. § 119(a) to Japanese Patent Application No. 2018-100563 filed on May 25, 2018. The above applications are hereby expressly incorporated by reference, in their entirety, into the present application.

BACKGROUND OF THE INVENTION

1. Field of the Invention

The present invention relates to a polarizer and an image display device.

2. Description of the Related Art

In the related ad, in a case where an attenuation function, a polarization function, a scattering function, a light-shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical rotation or birefringence in display. Further, a circular polarizer is used in an organic light emitting diode ((OLED) to prevent reflection of external light.

In the related art, iodine has been widely used as a dichroic material in these polarizers, but a polarizer that uses an organic dye in place of iodine as a dichroic material has also been examined.

For example, WO2017/154907A discloses a polarizer-forming composition which contains a polymer liquid crystal compound and a dichroic material.

SUMMARY OF THE INVENTION

As a result of preparation of a polarizer with reference to the examples of WO2017/154907A and evaluation of the degree of alignment thereof which are conducted by the present inventors under the above-described circumstance, it was clarified that further improvement of the degree of alignment is desirable in consideration of improvement of the performance of an image display device or the like expected in the future.

Further, in consideration of the above-described circumstances, an object of the present invention is to provide a polarizer with a high degree of alignment and an image display device including the polarizer.

As the result of intensive examination conducted by the present inventors in order to achieve the above-described object, it was found that the degree of alignment of a polarizer to be formed is improved by employing a polarizer which is formed of a polarizer-forming composition containing a liquid crystal compound, a first dichroic material, and a second dichroic material, in which both the first dichroic material and the second dichroic material are horizontally aligned, the first dichroic material is a compound compatible with the liquid crystal compound, and the second dichroic material is a compound which is not compatible with the liquid crystal compound, thereby completing the present invention.

That is, the present inventors found that the above-described problems can be solved by employing the following configurations.

[1] A polarizer which is formed of a polarizer-forming composition containing a liquid crystal compound, a first dichroic material, and a second dichroic material, in which the first dichroic material and the second dichroic material are aligned horizontally with respect to a surface of the polarizer, the first dichroic material is a compound compatible with the liquid crystal compound, and the second dichroic material is a compound which is not compatible with the liquid crystal compound.

[2] The polarizer according to [1], in which the second dichroic material is a dichroic azo dye represented by Formula (2), and a difference between a log P value of the second dichroic material and a log P value of the liquid crystal compound is 4.3 or greater.

[3] The polarizer according to [1] or [2], in which any one of the first dichroic material or the second dichroic material is a dichroic material having a maximum absorption wavelength in a range of 380 nm or greater and less than 455 nm.

[4] The polarizer according to any one of [1] to [3], in which any one of the first dichroic material or the second dichroic material is a dichroic material having a maximum absorption wavelength in a range of 560 nm or greater and less than 700 nm.

[5] The polarizer according to any one of [1] to [4], in which the first dichroic material contains a dichroic material having a maximum absorption wavelength in a range of 380 nm or greater and less than 455 nm and a dichroic material having a maximum absorption wavelength in a range of 455 nm or greater and less than 560 nm.

[6] An image display device comprising: the polarizer according to any one of [1] to [5].

As described below, according to the present invention, it is possible to provide a polarizer with a high degree of alignment and an image display device including the polarizer.

DESCRIPTION OF THE PREFERRED EMBODIMENTS

Hereinafter, the present invention will be described in detail.

The description of constituent elements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, parallel, orthogonal, horizontal, and vertical do not indicate parallel, orthogonal, horizontal, and vertical in a strict sense, but respectively indicate a range of parallel ±5°, a range of orthogonal ±5°, a range of horizontal ±5°, and a range of vertical ±5°.

Further, in the present specification, materials corresponding to respective components may be used alone or in combination of two or more kinds thereof. Here, in a case where two or more kinds of materials corresponding to respective components are used in combination, the content of the components indicates the total content of the combined materials unless otherwise specified.

Further, in the present specification, "(meth)acrylate" is a notation representing "acrylate" or "methacrylate", "(meth)acryl" is a notation representing "acryl" or "methacryl", and "(meth)acryloyl" is a notation representing "acryloyl" or "methacryloyl".

[Polarizer]

A polarizer according to the embodiment of the present invention is a polarizer formed of a polarizer-forming composition containing a liquid crystal compound, a first dichroic material, and a second dichroic material.

Further, in the polarizer according to the embodiment of the present invention, the first dichroic material and the second dichroic material are aligned horizontally with respect to the surface (main surface) of the polarizer. That is, it can be said that the first dichroic material and the second dichroic material are aligned perpendicular to the thickness direction of the polarizer.

Further, in the polarizer according to the embodiment of the present invention, the first dichroic material is a compound compatible with the liquid crystal compound, and the second dichroic material is a compound that is not compatible with the liquid crystal compound.

Here, the compatibility between the liquid crystal compound and the dichroic material can be confirmed by the following method.

First, two polarizers of an optical microscope (ECLIPSE E600 POL, manufactured by Nikon Corporation) are arranged so as to be orthogonal to each other, and a sample stand is set between the two polarizers.

Next, a sample composition obtained by mixing the liquid crystal compound contained in the polarizer-forming composition and a certain kind of dichroic material at a mass ratio is cast on glass, and this glass is set on a hot stage placed on the sample stand.

Next, the phase separation state of the sample is observed by raising or lowering the temperature of the hot stage in a range of higher than or equal to a higher temperature between the melting point of the liquid crystal compound and the melting point of the dichroic material and lower than or equal to a lower temperature between the isotropic phase transition temperature of the liquid crystal compound and the isotropic phase transition temperature of the dichroic material.

In this operation, in a case where phase separation is not observed, it is defined as "compatible". Further, in a case where phase separation is observed, it is defined as "incompatible".

According to the present invention, as described above, in the polarizer formed from the polarizer-forming composition containing the liquid crystal compound, the first dichroic material, and the second dichroic material, in a case where the alignments of the first dichroic material and the second dichroic material are both horizontal alignments, the first dichroic material is a compound compatible with the liquid crystal compound, and the second dichroic material is a compound incompatible with the liquid crystal compound, the degree of alignment of the polarizer to be formed is improved.

Although the details of the reason are not yet clear, the present inventors assume that the reason is as follows.

First, the present inventors presume that the second dichroic material which is incompatible with the liquid crystal compound affects the degree of alignment due to the array structure (for example, a crystal structure) thereof based on the comparison between Comparative Example 1 and Reference Example 1 described below.

Further, it is assumed that in a case where the liquid crystal compound is blended with the first dichroic material compatible with the liquid crystal compound, the physical properties of the matrix of the liquid crystal compound and the first dichroic material compatible with the liquid crystal compound are changed so that an array structure of the second dichroic material is likely to be formed, and thus a high degree of alignment can be realized, based on the comparison between the example and Comparative Example 1 (and Reference Example 1) described below.

[Polarizer-Forming Composition]

The polarizer-forming composition (hereinafter, also referred to as the "present composition") used for forming the polarizer according to the embodiment of the present invention contains a liquid crystal compound, a first dichroic material, and a second dichroic material.

The present composition may contain a solvent, a polymerization initiator, an interface modifier, and components other than those described above as necessary.

Hereinafter, each component will be described.

<Liquid Crystal Compound>

The present composition contains a liquid crystal compound. In a case where the composition contains a liquid crystal compound, the dichroic materials can be aligned with a high degree of alignment while the precipitation of the dichroic materials is suppressed.

The liquid crystal compound is a liquid crystal compound that does not exhibit dichroism.

As the liquid crystal compound, any of a low-molecular-weight liquid crystal compound or a polymer liquid crystal compound can be used. Here, the "low-molecular-weight liquid crystal compound" indicates a liquid crystal compound having no repeating unit in the chemical structure. The "polymer liquid crystal compound" indicates a liquid crystal compound having a repeating unit in the chemical structure.

Examples of the low-molecular-weight liquid crystal compound contains liquid crystal compounds described in JP2013-228706A.

Examples of the polymer liquid crystal compound include thermotropic liquid crystal polymers described in JP2011-237513A. Further, the polymer liquid crystal compound may have a crosslinkable group (such as an acryloyl group or a methacryloyl group) at a terminal.

The liquid crystal compound may be used alone or in combination of two or more kinds thereof.

The content of the liquid crystal compound is preferably in a range of 25 to 2000 parts by mass, more preferably in a range of 33 to 1000 parts by mass, and still more preferably in a range of 50 to 500 parts by mass with respect to 100 parts by mass which is the total content of the first dichroic material and the second dichroic material in the present composition. In a case where the content of the liquid crystal compound is in the above-described range, the degree of alignment of the polarizer is further improved.

From the viewpoint of further improving the degree of alignment of the polarizer, it is preferable that the liquid crystal compound is a polymer liquid crystal compound having a repeating unit represented by Formula (P) (hereinafter, also referred to as a "repeating unit (P)").

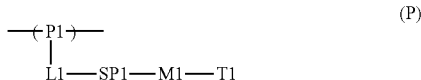

In Formula (P), P1 represents a main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and handle ability of a monomer serving as a raw material, a group represented by Formula (P1-A) is preferable.

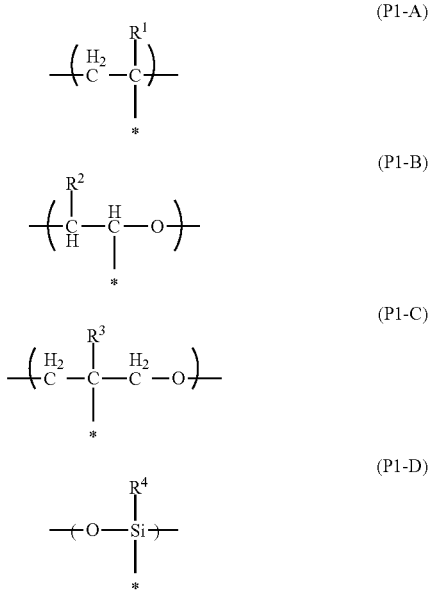

In Formulae (P1-A) to (P1-D), "*" represents a bonding position with respect to L1 in Formula (P).

In Formulae (P1-A) to (P1-D), $R^1$, $R^2$, $R^3$, and $R^4$ each independently represent a hydrogen atom, a halogen atom, a cyano group, or an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound having the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^{14}(OR^{15})_2$—. In the formula. $R^{14}$ has the same definition as that for $R^{14}$ in (P1-D), and a plurality of $R^{15}$'s each independently represent a hydrogen atom or an alkyl group having 1 to 10 carbon atoms.

In Formula (P), L1 represents a single bond or a divalent linking group.

Examples of the divalent linking group represented by L1 include —C(O)O—, —OC(O)—, —O—, —C(O)NR$^3$—, —NR$^3$C(O)—, —SO$_2$—, and —NR$^3$R$^4$—. In the formulae, $R^3$ and $R^4$ each independently represent a hydrogen atom or an alkyl group having 1 to 6 carbon atoms which may have a substituent.

In a case where P1 represents a group represented by Formula (P1-A), it is preferable that L1 represents a group represented by —C(O)O— from the viewpoint of further improving the degree of alignment of the polarizer.

In a case where P1 represents a group represented by any of Formulae (P1-B) to (P1-D), it is preferable that L1 represents a single bond from the viewpoint of further improving the degree of alignment of the polarizer.

In Formula (P), it is preferable that the spacer group represented by SP1 has at least one structure selected from the group consisting of an oxyethylene structure, an oxypropylene structure, a polysiloxane structure, and an alkylene fluoride structure from the viewpoints of easily exhibiting liquid crystallinity and the availability of raw materials.

Here, as the oxyethylene structure represented by SP1, a group represented by *—(CH$_2$—CH$_2$O)$_{n1}$—* is preferable. In the formula, n1 represents an integer of 1 to 20, and "*" represents a bonding position with respect to L1 or M1 in Formula (P). From the viewpoint of further improving the degree of alignment of the polarizer, n1 represents preferably an integer of 2 to 10, more preferably an integer of 2 to 4, and most preferably 3.

Further, from the viewpoint of further improving the degree of alignment of the polarizer, a group represented by *—(CH(CH$_3$)—CH$_2$O)$_{n2}$—* is preferable as the oxypropylene structure represented by SP1. In the formula, n2 represents an integer of 1 to 3, and "*" represents a bonding position with respect to L1 or M1.

Further, from the viewpoint of further improving the degree of alignment of the polarizer, a group represented by *—(Si(CH$_3$)$_2$—O)$_{n3}$—* is preferable as the polysiloxane structure represented by SP1. In the formula, n3 represents an integer of 6 to 10, and "*" represents a bonding position with respect to L1 or M1.

Further, from the viewpoint of further improving the degree of alignment of the polarizer, a group represented by *—(CF$_2$—CF$_2$)$_{n4}$—* is preferable as the alkylene fluoride structure represented by SP1. In the formula, n4 represents an integer of 6 to 10, and "*" represents a bonding position with respect to L1 or M1.

In Formula (P), the mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and can refer to, for example, particularly the description on pages 7 to 16 of "FlussigeKristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee.

As the mesogen group, for example, a group having at least one cyclic structure selected from the group consisting of an aromatic hydrocarbon group, a heterocyclic group, and an alicyclic group is preferable.

From the viewpoint of further improving the degree of alignment of the polarizer, the mesogen group contains preferably an aromatic hydrocarbon group, more preferably 2 to 4 aromatic hydrocarbon groups, and still more preferably 3 aromatic hydrocarbon groups.

From the viewpoints of exhibiting the liquid crystallinity, adjusting the liquid crystal phase transition temperature, and the availability of raw materials and synthetic suitability, and further improving the degree of alignment of the polarizer, as the mesogen group, a group represented by Formula (M1-A) or Formula (M1-B) is preferable, and a group represented by Formula (M1-B) is more preferable.

(M1-A)

(M1-B)

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent.

The divalent group represented by A1 is preferably a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the degree of alignment.

Examples of the atoms other than the carbon atoms constituting the divalent aromatic heterocyclic group include a nitrogen atom, a sulfur atom, and an oxygen atom. In a case where the aromatic heterocyclic group has a plurality of atoms constituting a ring other than carbon atoms, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimide-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of 1's may be the same as or different from each other.

In Formula (M1-B), A2 and A3 each independently represent a divalent group selected from the group consisting of an aromatic hydrocarbon group, a heterocyclic group, and an alicyclic group, Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint that the effects of the present invention are more excellent, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint that the effects of the present invention are more excellent, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)—C(Z')—, —C(Z)=N—, —N=C(Z)—, —C(Z)=C(Z')—C(O)N(Z")—, —N(Z")—C(O)—C(Z)=C(Z')—, —C(Z)—C(Z')—C(O)—, —S—C(O)—C(Z)=C(Z')—, —C(Z)=N—N=C(Z')—(Z, Z', and Z" each independently represent a hydrogen atom, an alkyl group having 1 to 4 carbon atoms, a cycloalkyl group, an aryl group, a cyano group, or a halogen atom), —N=N—, —S—, —S(O)—, —S(O)(O)—, —(O)S(O)O—, —O(O)S(O)O—, —SC(O)—, and —C(O)S—. Among these, from the viewpoint that the effects of the present invention are more excellent, —C(O)O— is preferable. LA1 may represent a group obtained by combining two or more of these groups.

Specific examples of M1 include the following structures. In the following specific examples, "Ac" represents an acetyl group.

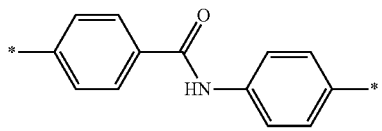 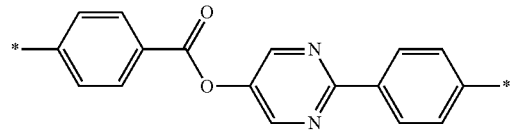

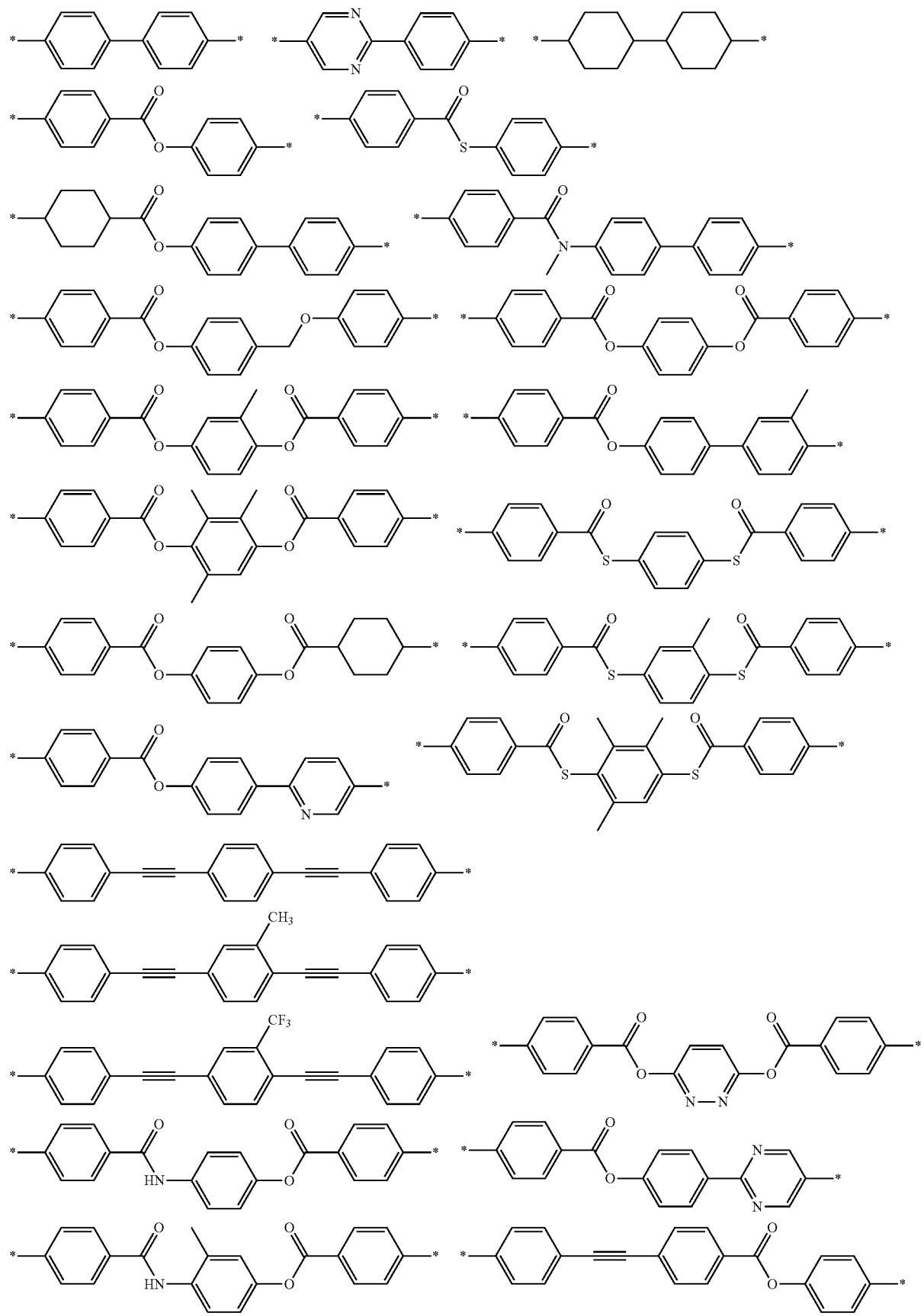

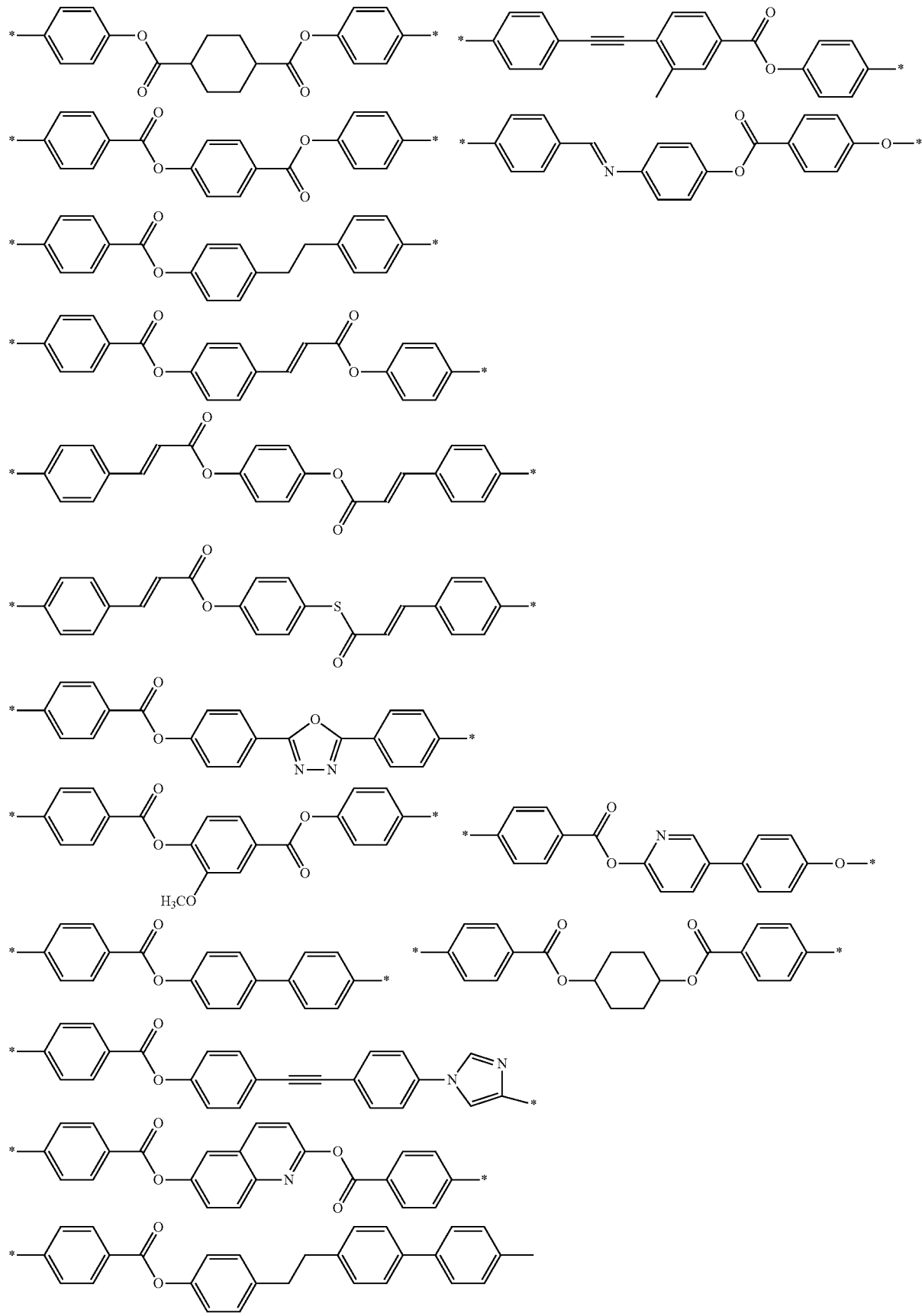

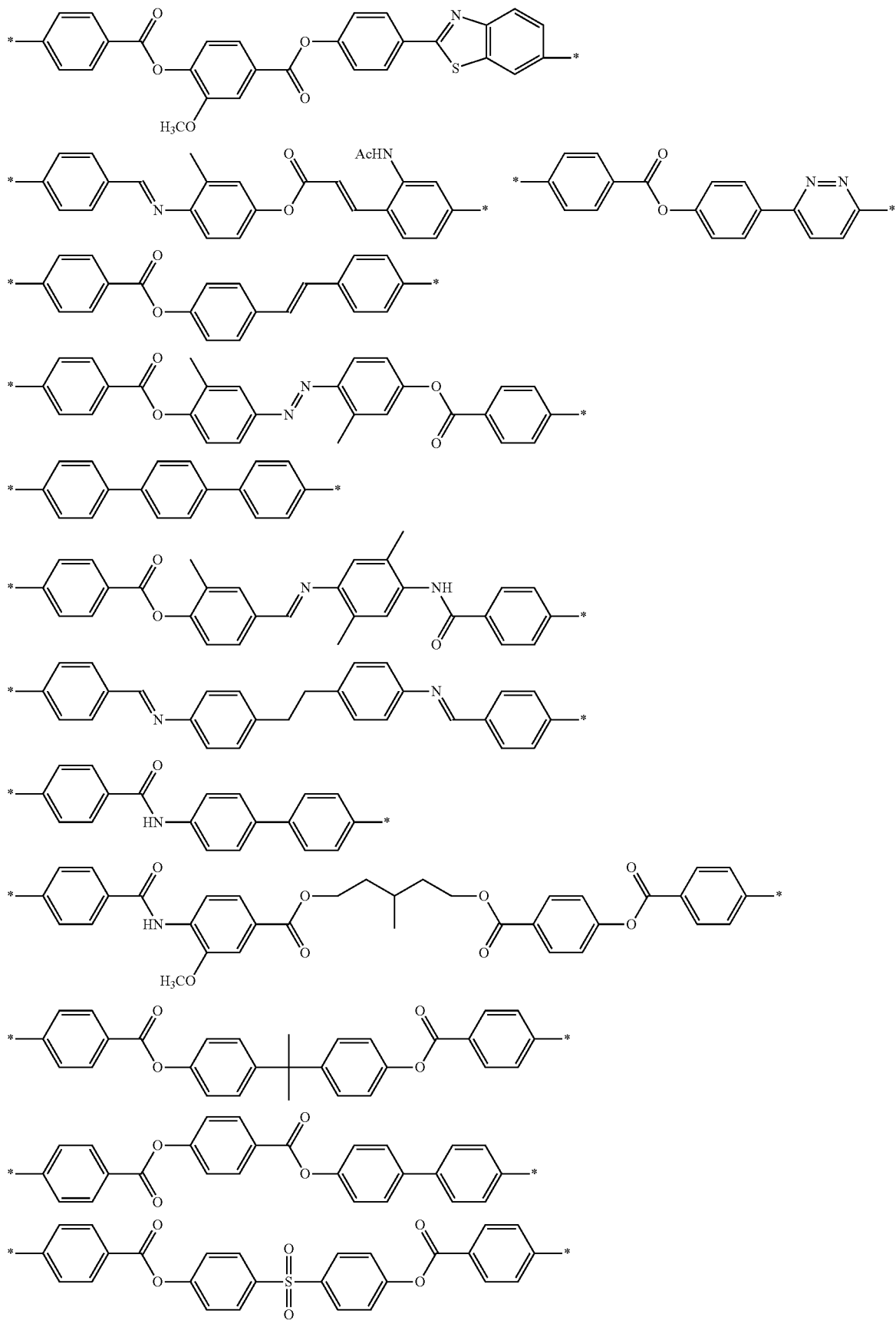

-continued
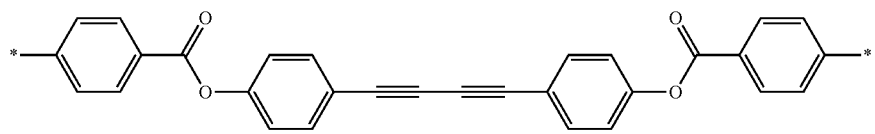
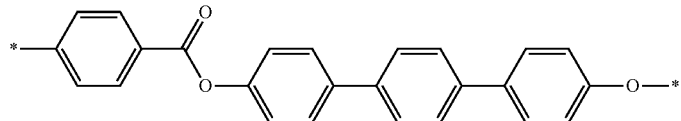
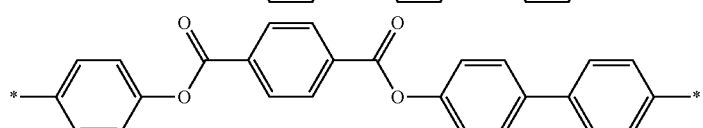
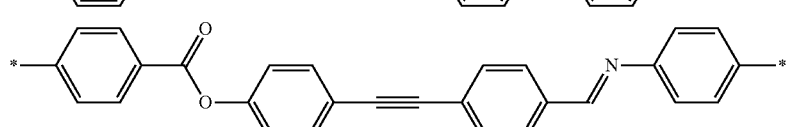
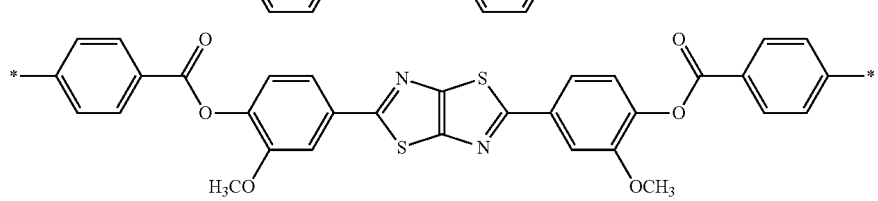
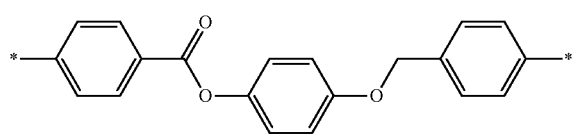
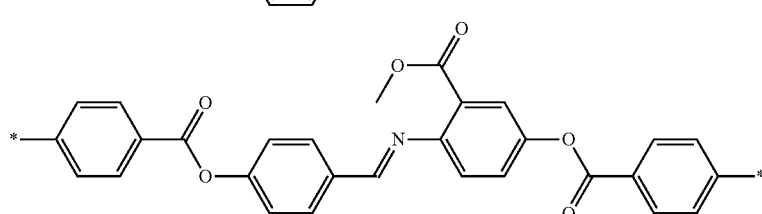
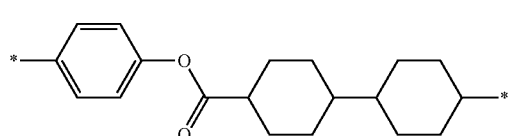
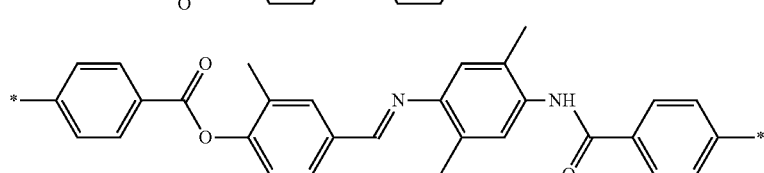
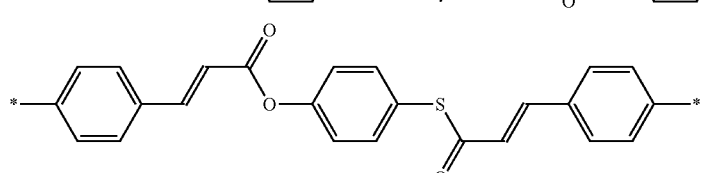
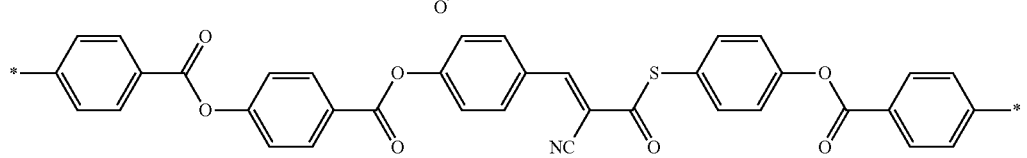

In Formula (P), examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group, Examples of the (meth)acryloyloxy group-containing group include a group represented by -L-A (L represents a single bond or a linking group, specific examples of the linking group are the same as those tier L1 and SP1 described above, and A represents a (meth)acryloyloxy group).

From the viewpoint that the effects of the present invention are more excellent, T1 represents preferably an alkoxy group having 1 to 10 carbon atoms, more preferably an alkoxy group having 1 to 5 carbon atoms, and still more preferably a methoxy group. These terminal groups may be further substituted with these groups or the polymerizable groups described in JP2010-244038A.

From the viewpoint that the effects of the present invention are more excellent, the number of atoms in the main chain of T1 is preferably in a range of 1 to 20, more preferably in a range of 1 to 15, still more preferably in a range of 1 to 10, and particularly preferably in a range of 1 to 7. In a case where the number of atoms in the main chain of T1 is 20 or less, the degree of alignment of the polarizer is further improved. Here, the "main chain" in T indicates the longest molecular chain bonded to M1, and the number of hydrogen atoms is not included in the number of atoms in the main chain of T1. For example, the number of atoms in the main chain is 4 in a case where T1 represents an n-butyl group, the number of atoms in the main chain is 3 in a case where T1 represents a sec-butyl group.

From the viewpoint of further improving the degree of alignment of the polarizer, the content of the repeating unit (P) is preferably in a range of 20% to 100% by mass with respect to 100% by mass of all the repeating units of the polymer liquid crystal compound.

In the present invention, the content of each repeating unit contained in the polymer liquid crystal compound is calculated based on the charged amount (mass) of each monomer used for obtaining each repeating unit.

The polymer liquid crystal compound may have only one or two or more kinds of the repeating units (P). Among these, from the viewpoint that the effects of the present invention are more excellent, the polymer liquid crystal compound may have two kinds of the repeating units (P).

In a case where the polymer liquid crystal compound has two kinds of the repeating units (P), from the viewpoint of further improving the degree of alignment of the polarizer, it is preferable that the terminal group represented by T1 in one (repeating unit A) is an alkoxy group and the terminal group represented by T1 in the other (repeating unit B) is a group other than the alkoxy group.

From the viewpoint of further improving the degree of alignment of the polarizer, as the terminal group represented by T1 in the repeating unit B, an alkoxycarbonyl group, a cyano group, or a (meth)acryloyloxy group-containing group is preferable, and an alkoxycarbonyl group or a cyano group is more preferable.

From the viewpoint of further improving the degree of alignment of the polarizer, the ratio (A/B) of the content of the repeating unit A in the polymer liquid crystal compound to the content of the repeating unit B in the polymer liquid crystal compound is preferably in a range of 50/50 to 95/5, more preferably in a range of 60/40 to 93/7, and still more preferably in a range of 70/30 to 90/10.

(Weight-Average Molecular Weight)

From the viewpoint of further improving the degree of alignment of the polarizer, the weight-average molecular weight (Mw) of the polymer liquid crystal compound is preferably in a range of 1000 to 500000 and more preferably in a range of 2000 to 300000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10000 to 300000.

In addition, from the viewpoint of the temperature latitude of the degree of alignment, the weight-average molecular weight (Mw) of the polymer liquid crystal compound is preferably less than 10000 and more preferably 2000 or greater and less than 10000.

Here, the weight-average molecular weight and the number average molecular weight in the present invention are values measured according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2800000 to 1050 (Mw/Mn=1.03 to 1.06) are used.

(log P Value)

In the present invention, from the viewpoint that the compatibility between the first dichroic material and the second dichroic material described below is easily adjusted, the log P value of the liquid crystal compound is preferably in a range of 4.0 to 10, more preferably in a range of 4.3 to 9.5, and still more preferably in a range of 4.3 to 5.5.

Here, the log P value is an index for expressing the properties of the hydrophilicity and hydrophobicity of a chemical structure and is also referred to as a hydrophilic-hydrophobic parameter. The log P value can be calculated using software such as ChemBioDrawUltra or HSPiP (Ver. 4.1.07). Further, the log P value can be acquired experimentally by the method of the OECD Guidelines for the Testing of Chemicals, Sections 1, Test No. 117, or the like. In the present invention, a value calculated by inputting the structural formula of a compound to HSPiP (Ver. 4107) is employed as the log P value unless otherwise specified.

<First Dichroic Material>

The first dichroic material contained in the present composition is a dichroic material compatible with the above-described liquid crystal compound.

Examples of such a first dichroic material include materials compatible with the above-described liquid crystal compound among known dichroic materials of the related art, such as a visible light absorbing material (a dichroic dye), a light emitting material (a fluorescent material or a phosphorescent material), an ultraviolet absorbing material, an infrared absorbing material, a non-linear optical material, a carbon nanotube, and an inorganic material (for example, a quantum rod).

Specific suitable examples of the first dichroic material include a dichroic dye compound having a structure represented by Formula (1Y) (hereinafter, also referred to as a "dichroic dye compound (1Y)").

Here, it is preferable that both a and h represent 1, that is, the crosslinkable group is introduced into both terminals of the dichroic dye compound (1Y). In this manner, there are advantages that the solubility of the dichroic dye compound (1Y) is improved and the durability of the polarizer is improved.

In Formula (1Y), $L_1$ represents a monovalent substituent in a case where a represents 0, and $L_1$ represents a single bond or a divalent linking group in a case where a represents 1. Further, $L_2$ represents a monovalent substituent in a case where b represents 0, and $L_2$ represents a single bond or a divalent linking group in a case where b represents 1.

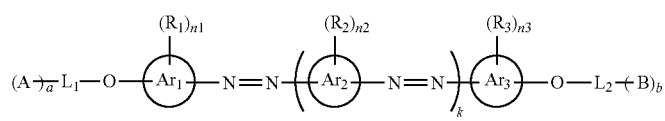

(1Y)

In Formula (1Y), A and B each independently represent a crosslinkable group.

In Formula (1Y), a and b each independently represent 0 or 1. Here, an expression of "a+b≥1" is satisfied.

In Formula (1Y), L1 represents a monovalent substituent in a case where a represents 0, and $L_1$ represents a single bond or a divalent linking group in a case where a represents 1. Further, $L_2$ represents a monovalent substituent in a case where b represents 0, and $L_2$ represents a single bond or a divalent linking group in a case where b represents 1.

In Formula (1Y), represents a (n1+2)-valent aromatic hydrocarbon group or a heterocyclic group, $Ar_2$ represents a (n2+2)-valent aromatic hydrocarbon group or a heterocyclic group, and $Ar_3$ represents a (n3+2)-valent aromatic hydrocarbon group or a heterocyclic group.

In Formula (1Y), $R_1$, $R_2$, and $R_3$ each independently represent a monovalent substituent. A plurality of $R_1$'s may be the same as or different from each other in a case where an expression of "n1≥2" is satisfied, a plurality of $R_2$'s may be the same as or different from each other in a ease where an expression of "n2≥2" is satisfied, and a plurality of $R_3$'s may be the same as or different from each other in a case where an expression of "n3≥2" is satisfied.

In Formula (1Y), k represents an integer of 1 to 4. In a case where an expression of "k≥2" is satisfied, a plurality of $Ar_2$'s may be the same as or different from each other and a plurality of $R_2$'s may be the same as or different from each other.

In Formula (1Y), n1, n2, and n3 each independently represent an integer of 0 to 4. Here, an expression of "n1+n2+n3≥0" is satisfied in a ease where k represents 1, and an expression of "n1+n2+n3≥1" is satisfied in a case where k is greater than or equal to 2.

In Formula (1Y), examples of the crosslinkable group represented by A and B include the polymerizable groups described in paragraphs [0040] to [0050] of JP2010-244038A. Among these, an acryloyl group, a methacryloyl group, an epoxy group, an oxetanyl group, and a styryl group are preferable from the viewpoint of improving the reactivity and the synthetic suitability, and an acryloyl group and a methacryloyl group are preferable from the viewpoint of further improving the solubility.

In Formula (1Y), a and h each independently represent 0 or 1, and an expression of "a+b≥1" is satisfied. That is, the dichroic dye compound (1Y) contains at least one crosslinkable group at a terminal.

It is preferable that both $L_1$ and $L_2$ represent a single bond or a divalent linking group and more preferable that both represent a divalent linking group. In this manner, the solubility of the dichroic dye compound (1Y) is improved.

As the monovalent substituent represented by $L_1$ and $L_2$, a group to be introduced to increase the solubility of the dichroic dye compound (1Y) or a group having an electron-donating property or an electron-withdrawing property which is to be introduced to adjust the color tone of the dye is preferable.

Examples of the substituent include an alkyl group (preferably an alkyl group having 1 to 20 carbon atoms, more preferably an alkyl group having 1 to 12 carbon atoms, and particularly preferably an alkyl group having 1 to 8 carbon atoms, and examples thereof a methyl group, an ethyl group, an isopropyl group, a test-butyl group, an n-octyl group, an n-decyl group, an n-hexadecyl group, a cyclopropyl group, a cyclopentyl group, and a cyclohexyl group), an alkenyl group (preferably an alkenyl group having 2 to 20 carbon atoms, more preferably an alkenyl group having 2 to 12 carbon atoms, and particularly preferably an alkenyl group having 2 to 8 carbon atoms, and examples thereof include a vinyl group, an allyl group, a 2-butenyl group, and a 3-pentenyl group), an alkynyl group (preferably an alkynyl group having 2 to 20 carbon atoms, more preferably an alkynyl group 2 to 12 carbon atoms, and particularly preferably an alkynyl group having 2 to 8 carbon atoms, and examples thereof include a propargyl group and a 3-pentynyl group), an aryl group (preferably an aryl group having 6 to 30 carbon atoms, more preferably an aryl group having 6 to 20 carbon atoms, and particularly preferably an aryl group having 6 to 12 carbon atoms, and examples thereof include a phenyl group, a 2,6-diethylphenyl group, a 3,5-ditrifluoromethylphenyl group, a naphthyl group, and a biphenyl group), a substituted or unsubstituted amino group (preferably an amino group having 0 to 20 carbon atoms, more preferably an amino group having 0 to 10 carbon atoms, and particularly preferably an amino group having 0 to 6 carbon atoms, and examples thereof include an unsubstituted amino group, a methylamino group, a dimethylamino group, a diethylamino group, and an anilino group), an alkoxy group (preferably an alkoxy group having 1 to 20 carbon atoms and more preferably an alkoxy group having 1 to 15 carbon atoms, and examples thereof include a methoxy group, an ethoxy group, and a butoxy group), an oxycarbonyl group (preferably an oxycarbonyl group having 2 to 20 carbon atoms, more preferably an oxycarbonyl group having 2 to 15 carbon atoms, and particularly preferably an oxycarbonyl group having 2 to 10 carbon atoms, and examples thereof include a methoxycarbonyl group, an ethoxycarbonyl group, and a phenoxycarbonyl group), an acyloxy group (preferably an acyloxy group having 2 to 20 carbon atoms, more preferably an acyloxy group having 2 to 10 carbon atoms, and particularly preferably an acyloxy group having 2 to 6 carbon atoms, and examples thereof include an acetoxy group and a benzoyloxy group), an acylamino group (preferably an acylamino group having 2 to 20 carbon atoms, more preferably an acylamino group having 2 to 10 carbon atoms, and particularly preferably an acylamino group having 2 to 6 carbon atoms, and examples thereof include an acetylamino group and a benzoylamino group), an alkoxycarbonylamino group (preferably an alkoxycarbonylamino group having 2 to 20 carbon atoms, more preferably an alkoxycarbonylamino group having 2 to 10 carbon atoms, and particularly preferably an alkoxycarbonylamino group having 2 to 6 carbon atoms, and examples thereof include a methoxycarbonylamino group), an aryloxycarbonylamino group (preferably an aryloxycarbonylamino group having 7 to 20 carbon atoms, more preferably an aryloxycarbonylamino group having 7 to 16 carbon atoms, and particularly preferably an aryloxycarbonylamino group having 7 to 12 carbon atoms, and examples thereof include a phenyloxycarbonylamino group), a sulfonylamino group (preferably a sulfonylamino group having 1 to 20 carbon atoms, more preferably a sulfonylamino group having 1 to 10 carbon atoms, and particularly preferably a sulfonylamino group having 1 to 6 carbon atoms, and examples thereof include a methanesulfonylamino group and a benzenesulfonylamino group), a sulfamoyl group (preferably a sulfamoyl group having 0 to 20 carbon atoms, more preferably a sulfamoyl group having 0 to 10 carbon atoms, and particularly preferably a sulfamoyl group having 0 to 6 carbon atoms, and examples thereof include a sulfamoyl group, a methylsulfamoyl group, a dimethylsulfamoyl group, and a phenylsulfamoyl group), a carbamoyl group (preferably a carbamoyl group having 1 to 20 carbon atoms, more preferably a carbamoyl group having 1 to 10 carbon atoms, and particularly preferably a carbamoyl group having 1 to 6 carbon atoms, and examples thereof include an unsubstituted carbamoyl group, a methylcarbamoyl group, a diethylcarbamoyl group, and a phenylcarbamoyl group), an alkylthio group (preferably an alkylthio group having 1 to 20 carbon atoms, more preferably ail alkylthio group having 1 to 10 carbon atoms, and particularly preferably an alkylthio group having 1 to 6 carbon atoms, and examples thereof include a methylthio group and an ethylthio group), an arylthio group (preferably an arylthio group having 6 to 20 carbon atoms, more preferably an arylthio group having 6 to 16 carbon atoms, and particularly preferably an arylthio group having 6 to 12 carbon atoms, and examples thereof include a phenylthio group), a sulfonyl group (preferably a sulfonyl group having 1 to 20 carbon atoms, more preferably a sulfonyl group having 1 to 10 carbon atoms, and particularly preferably a sulfonyl group having 1 to 6 carbon atoms, and examples thereof include a mesyl group and a tosyl group), a sulfinyl group (preferably a sulfinyl group having 1 to 20 carbon atoms, more preferably a sulfinyl group having 1 to 10 carbon atoms, and particularly preferably a sulfinyl group having 1 to 6 carbon atoms, and examples thereof include a methanesulfinyl group and a benzenesulfinyl group), a ureido group (preferably a ureido group having 1 to 20 carbon atoms, more preferably a ureido group having 1 to 10 carbon atoms, and particularly preferably a ureido group having 1 to 6 carbon atoms, and examples thereof include an unsubstituted ureido group, a methylureido group, and a phenylureido group), a phosphoric acid amide group (preferably a phosphoric acid amide group having 1 to 20 carbon atoms, more preferably a phosphoric acid amide group having 1 to 10 carbon atoms, and particularly preferably a phosphoric acid amide group having 1 to 6 carbon atoms, and examples thereof include a diethylphosphoric acid amide group and a phenylphosphoric acid amide group), a heterocyclic group (preferably a heterocyclic group having 1 to 30 carbon atoms and more preferably a heterocyclic group having 1 to 12 carbon atoms, and examples thereof include a heterocyclic group having a heteroatom such as a nitrogen atom, an oxygen atom, or a sulfur atom, and examples of the heterocyclic group having a heteroatom include an imidazolyl group, a pyridyl group, a quinolyl group, a fury group, a piperidyl group, a morpholino group, a benzoxazolyl group, a benzimidazolyl group, and a benzthiazolyl group), a silyl group (preferably a silyl group having 3 to 40 carbon atoms, more preferably a silyl group having 3 to 30 carbon atoms, and particularly preferably a silyl group having 3 to 24 carbon atoms, and examples thereof include a trimethylsilyl group and a triphenylsilyl group), a halogen atom (such as a fluorine atom, a chlorine atom, a bromine atom, and an iodine atom), a hydroxy group, a mercapto group, a cyano group, a nitro group, a hydroxamic acid group, a sulfino group, a hydrazino group, an imino group, and an azo group. These substituents may be further substituted with these substituents. Further, in a case where two or more substituents are present, these may be the same as or different from each other. Further, these may be bonded to each other to form a ring where possible.

As the group in which the above-described substituent is further substituted with the above-described substituent, an $R_B—(O—R_A)_{na}—$ group which is a group in which an alkoxy group is substituted with an alkyl group is exemplified. Here, in the formula, $R_A$ represents an alkylene group having 1 to 5 carbon atoms, $R_B$ represents an alkyl group having 1 to 5 carbon atoms, and na represents an integer of 1 to 10 (preferably an integer of 1 to 5 and more preferably an integer of 1 to 3).

Among these, as the monovalent substituent represented by $L_1$ and $L_2$, an alkyl group, an alkenyl group, an alkoxy group, and groups in which these groups are further substituted with these groups (for example, $R_B—(O—R_A)_{na}—$ group) are preferable, an alkyl group, an alkoxy group, and groups in which these groups are further substituted with these groups (for example, an $R_B—(O—R_A)_{na}—$ group) are more preferable.

Examples of the divalent linking group represented by $L_1$ and $L_2$ include —O—, —S—, —CO—, —COO—, —OCO—, —O—CO—O—, —CO—NR$_N$—, —O—CO—NR$_N$—, —NR$_N$—CO—NR$_N$—, —SO$_2$—, —SO—, an alkylene group, a cycloalkylene group, an alkenylene group, and a group obtained by combining two or more of these groups.

Among these, a group obtained by combining an alkylene group with one or more groups selected from the group consisting of —O—, —COO—, —OCO— and —O—CO—O— is preferable.

Here, $R_N$ represents a hydrogen atom or an alkyl group. In a case where a plurality of $R_N$'s are present, the plurality of $R_N$'s may be the same as or different from each other.

From the viewpoint of improving the solubility of the dichroic dye compound (1Y), the number of atoms in the main chain of $L_1$ or $L_2$ is preferably 3 or greater and more preferably 5 or greater. The upper limit of the number of atoms in the main chain is preferably 12 or less and more preferably 10 or less.

Here, in a case where A is present in Formula (1Y), the "main chain" of LE indicates a portion required for directly linking "A" with the "O" atom linked to $L_1$, and the "number of atoms in the main chain" indicates the number of atoms constituting the above-described portion. Similarly, in a case where B is present in Formula (1Y), the "main chain" of $L_2$ indicates a portion required for directly linking "B" with the "O" atom linked to L2, and the "number of atoms in the main chain" indicates the number of atoms constituting the above-described portion. Further, the "number of atoms in the main chain" does not include the number of atoms in a branched chain described below.

Further, in a case where A is not present, the "number of the main chain of atoms" in $L_1$ indicates the number of atoms in $L_1$ that does not have a branched chain. In a case where B is not present, the "number of the main chain of atoms" in $L_2$ indicates the number of atoms in $L_2$ that does not have a branched chain.

Specifically, in Formula (D1), the number of atoms in the main chain of $L_1$ is 5 (the number of atoms in the dotted frame on the left side of Formula (D1)), and the number of atoms in the main chain of $L_2$ is 5 (the number of atoms in the dotted frame on the right side of Formula (D1)). Further, in Formula (D10), the number of atoms in the main chain of $L_1$ is 7 (the number of atoms in the dotted frame on the left side of Formula (D10)), and the number of atoms in the main chain of $L_2$ is 5 (the number of atoms in the dotted frame on the right side of Formula (D10)).

$L_1$ and $L_2$ may have a branched chain.

Here, in a case where A is present in Formula (1Y), the "branched chain" of $L_1$ indicates a portion other than a portion required for directly linking "A" with the "O" atom linked to $L_1$ in Formula (1Y). Similarly, in a case where B is present in Formula (1Y), the "branched chain" of $L_2$ indicates a portion other than a portion required for directly linking "B" with the "O" atom linked to $L_2$ in Formula (1Y).

Further, in a case where A is not present in Formula (1Y), the "branched chain" of $L_1$ indicates a portion other than the longest atomic chain (that is, the main chain) extending from the "O" atom linked to $L_1$ in Formula (1Y) which is the starting point. Similarly, in a case where B is not present in Formula (1Y), the "branched chain" of $L_2$ indicates a portion other than the longest atomic chain (that is, the main chain) extending from the "O" atom linked to $L_2$ in Formula (1Y) which is a starting point.

The number of atoms in the branched chain is preferably 3 or less. In a case where the number of atoms in the branched chain is set to 3 or less, there is an advantage that the degree of alignment of the polarizer is further improved. Further, the number of atoms in the branched chain does not include the number of hydrogen atoms.

In Formula (1Y), $Ar_1$ represents an (n1+2)-valent (for example, trivalent in a case where n1 represents 1) aromatic hydrocarbon group or heterocyclic group, $Ar_2$ represents an (n2+2)-valent (for example, trivalent in a ease where n2 represents 1) aromatic hydrocarbon group or heterocyclic group, and $Ar_3$ represents an (n3+2)-valent (for example, trivalent in a case where n3 represents 1) aromatic hydrocarbon group or heterocyclic group. Here, $Ar_1$ to $Ar_3$ can be respectively rephrased as a divalent aromatic hydrocarbon group or a divalent heterocyclic group substituted with n1 to n3 substituents ($R_1$ to $R_3$ described below).

The divalent aromatic hydrocarbon group represented by $Ar_1$ to $Ar^3$ may be monocyclic or may have a bicyclic or higher cyclic fused ring structure. From the viewpoint of further improving the solubility, the number of rings of the divalent aromatic hydrocarbon group is preferably 1 to 4, more preferably 1 or 2, and still more preferably 1 (that is, a phenylene group).

Specific examples of the divalent aromatic hydrocarbon group include a phenylene group, an azulene-diyl group, a naphthylene group, a fluorene-diyl group, an anthracene-diyl group, and a tetracene-diyl group. From the viewpoints of further improving the solubility, a phenylene group or a naphthylene group is preferable, and a phenylene group is more preferable.

The divalent heterocyclic group may be any of aromatic or non-aromatic, but a divalent aromatic heterocyclic group is preferable as the divalent heterocyclic group from the viewpoint of further improving the degree of alignment.

The divalent aromatic heterocyclic group may be monocyclic or may have a bicyclic or higher cyclic fused ring structure. Examples of atoms other than the carbon atoms constituting the aromatic heterocyclic group include a nitrogen atom, a sulfur atom, and an oxygen atom. In a case where the aromatic heterocyclic group has a plurality of atoms constituting a ring other than carbon atoms, these may be the same as or different from each other.

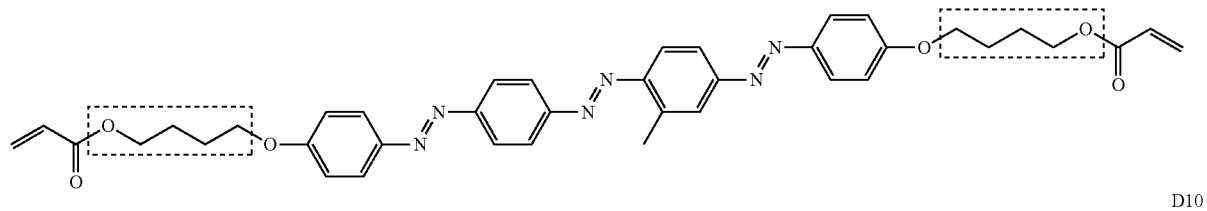

D1

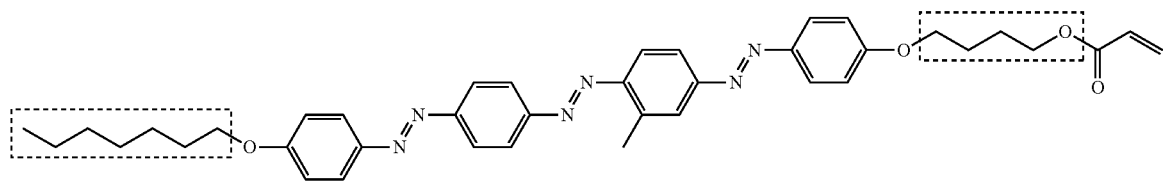

D10

Specific examples of the aromatic heterocyclic group include a pyridylene group (pyridine-diyl group), thienylene group (thiophene-diyl group), a quinolylene group (quinoline-diyl group), an isoquinolylene group (isoquinolin-diyl group), a thiazole-diyl group, a benzothiadiazole-diyl group, a phthalimide-diyl group, a thienothiazole-diyl group (in the present invention, referred to as a "thienothiazole group"), a thienothiophene-diyl group, and a thienooxazole-diyl group.

Among these, as the divalent aromatic heterocyclic group, a group having a monocycle or a bicyclic fused ring structure represented by the following structural formula can be preferably used. Further, in the following structural formulae below, "*" represents a bonding position with respect to an azo group or an oxygen atom in Formula (1Y).

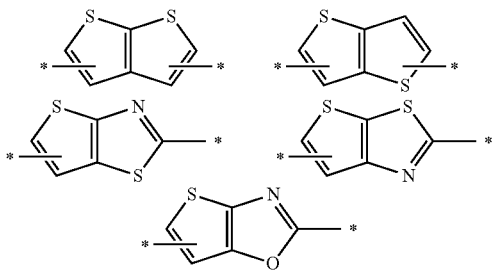

In Formula (1Y), $Ar_1$ to $Ar_3$ represent preferably a divalent aromatic hydrocarbon group and more preferably a phenylene group.

Here, in a case where $Ar_1$ represents a phenylene group, the azo group and the oxygen atom bonded to $Ar_1$ are positioned preferably in the meta or para position and more preferably in the para position. In this manner, the degree of alignment of the polarizer is further improved. From the same viewpoint as described above, in a case where $Ar_2$ represents a phenylene group, two azo groups bonded to $Ar_2$ are positioned preferably in the meta position or para position and preferably in the para position. Similarly, in a case where $Ar_3$ represents a phenylene group, the azo group and the oxygen atom bonded to $Ar_3$ are positioned preferably in the meta position or para position and preferably in the para position.

In Formula (1Y), in a case where $Ar_1$, $Ar_2$, and $Ar_3$ each have a fused ring structure, it is preferable that all the plurality of rings constituting the fused ring structure are linked to one another along the longitudinal direction of the structure represented by Formula (1Y). In this manner, it possible to prevent the molecules of the dichroic dye compound (1Y) from being bulky in a direction (short direction) intersecting with the longitudinal direction, and thus the alignment of the molecules is more excellent so that the degree of alignment of the polarizer is further improved.

Here, the longitudinal direction of the structure represented by Formula (1Y) indicates an extending direction of the structure represented by Formula (1Y). Specifically, the longitudinal direction indicates an extending direction of the bonding site of the azo group bonded to $Ar_1$, $Ar_2$, and $Ar_3$ and the bonding site of the ether bond (oxygen atom) bonded thereto.

As a specific example of an embodiment in which all the plurality of rings constituting the fused ring structure are linked to one another along the longitudinal direction of the structure represented by Formula (1Y), a fused ring structure represented by Formula (Ar-1) is shown below. That is, in a case where $Ar_1$, $Ar_2$, and $Ar_3$ have a fused ring structure, it preferable that $Ar_1$, $Ar_2$, and $Ar_3$ have a fused ring structure represented by Formula (Ar-1) shown below.

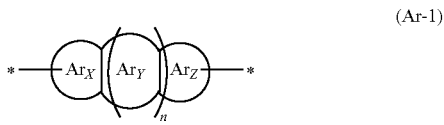

In Formula (Ar-1), $Ar_X$, $Ar_Y$, and $Ar_Z$ each independently represent a benzene ring or a monocyclic heterocycle. n represents an integer of 0 or greater. Further, "*" represents a bonding position with respect to an azo group or an oxygen atom in Formula (1Y).

As the monocyclic heterocycle in Formula (Ar-1), a monocyclic aromatic heterocycle is preferable. Examples of atoms other than the carbon atoms constituting the monocyclic aromatic heterocyclic group include a nitrogen atom, a sulfur atom, and an oxygen atom. Specific examples of the monocyclic aromatic heterocycle include a pyridine ring, a thiophene ring, a thiazole ring, and an oxazole ring.

Further, $Ar_X$, $Ar_Y$, and $Ar_Z$ may have a substituent. Examples of such a substituent include monovalent substituents for $R_1$ to $R_3$ described below.

n represents an integer of 0 or greater, preferably 0 to 2, more preferably 0 or 1, and still more preferably 0.

In Formula (1Y), $R_1$, $R_2$, and $R_3$ each independently represent a monovalent substituent.

As the monovalent substituent represented by $R_1$, $R_2$, and $R_3$, a halogen atom, a cyano group, a hydroxy group, an alkyl group, an alkoxy group, a fluorinated alkyl group, —O—$(C_2H_4O)$m-R', —O—$(C_3H_6O)$m-R', an alkylthio group, an oxycarbonyl group, a thioalkyl group, an acyloxy group, an acylamino group, an alkoxycarbonylamino group, a sulfonylamino group, a sulfamoyl group, a carbamoyl group, a sulfinyl group, or a ureido group is preferable. Here, R' represents a hydrogen atom, a methyl group, or an ethyl group, and m represents an integer of 1 to 6. These substituents may be further substituted with these substituents.

Among these, from the viewpoint of further improving the solubility of the dichroic dye compound (1Y), a fluorine atom, a chlorine atom, a methyl group, an ethyl group, a propyl group, a methoxy group, an ethoxy group, a propoxy group, a hydroxy group, a trifluoromethyl group, —O—$(C_2H_4O)$m-R', or —O—$(C_3H_6O)$m-R' is preferable, and a trifluoromethyl group, a methoxy group, a hydroxy group, —O—$(C_2H_4O)$m-R', or —O—$(C_3H_6O)_m$—R' is more preferable as the monovalent substituent represented by $R_1$, $R_2$, and $R_3$.

In the monovalent substituent represented by $R_1$, $R_2$, and $R_3$, the number of atoms in the main chain is preferably in a range of 1 to 15 and more preferably in a range of 1 to 12 from the viewpoint of the balance between the solubility of the dichroic dye compound (1Y) and the alignment of the polarizer. Here, in the monovalent substituent represented by $R_2$, and $R_3$, "the number of atoms in the main chain" indicates the number of atoms of $R_1$, $R_2$, or $R_3$ which does not have a branched chain. Further, the "branched chain" indicates a portion other than the longest atomic chain (that is, the main chain) extending from any of $Ar_1$ to $Ar_3$ in Formula (1Y) which is a starting point.

In a case where Formula (1Y) has at least one or more substituent selected from $R_1$, $R_2$, and $R_3$, it is preferable that at least one condition selected from the following conditions (R1) to (R3) is satisfied. In this manner, the solubility of the dichroic dye compound (1Y) is further improved.

Condition (R1): In $Ar_1$, at least one $R_1$ and an azo group are positioned to be adjacent to each other Condition (R2): In $Ar_2$, at least one $R_2$ and at least one azo group are positioned to be adjacent to each other Condition (R3): In $Ar_3$, at least one $R_3$ and an azo group are positioned to be adjacent to each other As a specific example of the condition (R1), in a case where $Ar_1$ represents a phenylene group, an embodiment in which $R_1$ is positioned in the ortho position with respect to the azo group bonded to $Ar_1$ is exemplified. As a specific example of the condition (R2), in a case where $Ar_2$ represents a phenylene group, an embodiment in which $R_2$ is positioned in the ortho position with respect to at least one azo group is exemplified. As a specific example of the condition (R3), in a case where $Ar_1$ represents a phenylene group, an embodiment in which $R_3$ is positioned in the ortho position with respect to the azo group bonded to $Ar_3$ is exemplified.

In Formula (1Y), k represents an integer of 1 to 4. Here, from the viewpoints of excellent light fastness while ensuring excellent solubility, it is preferable that k represents 2 or greater. Meanwhile, from the viewpoint of more excellent solubility of the dichroic dye compound (1Y), it is preferable that k represents 1.

In Formula (1Y), n1, n2, and n3 each independently represent an integer of 0 to 4 and preferably an integer of 0 to 3.

Here, an expression of "n1+n2+n3≥0" is satisfied in a case where k represents 1. That is, in a case where Formula (1Y) has a bisazo structure, sufficient solubility is obtained regardless of the presence or absence of the substituents ($R_1$ to $R_3$ in Formula (1Y)), but it is preferable that the substituents are present from the viewpoint of further improving the solubility.

In a case where k represents 1, n1+n2+n3 is preferably in a range of 0 to 9, more preferably in a range of 1 to 9, and still more preferably in a range of 1 to 5.

Meanwhile, in a case where k is greater than or equal to 2, an expression of "n1+n2+n3≥1" is satisfied. That is, in a case where Formula (1Y) has a trisazo structure, a tetrakisazo structure, or a pentakisazo structure, at least one substituent ($R_1$ to $R_3$ in Formula (1Y)) is present.

In a case where k is greater than or equal to 2, n2+n3 is preferably in a range of 1 to 9 and more preferably in a range of 1 to 5.

Specific examples of the dichroic dye compound (1Y) are shown below, but the present invention is not limited thereto.

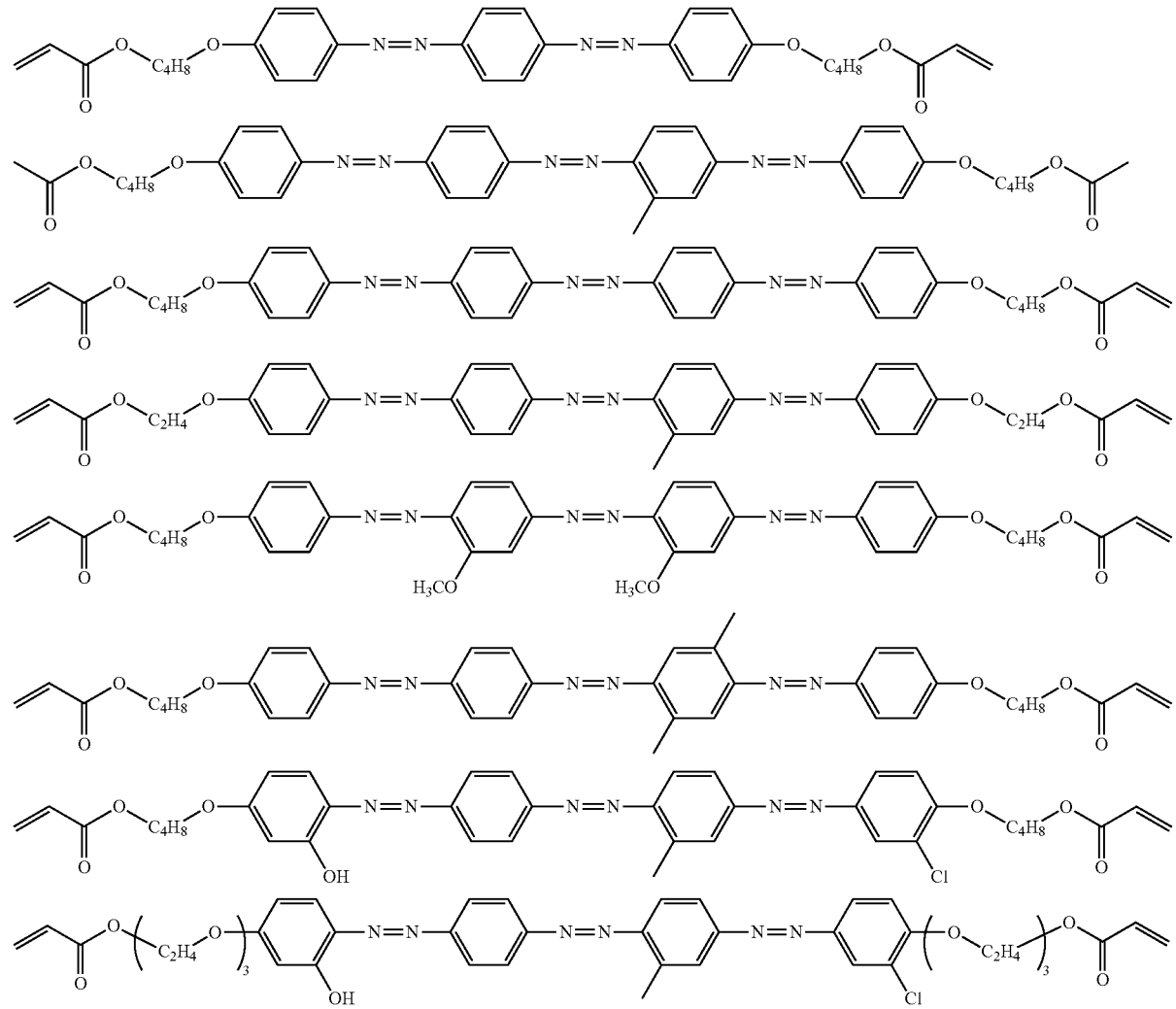

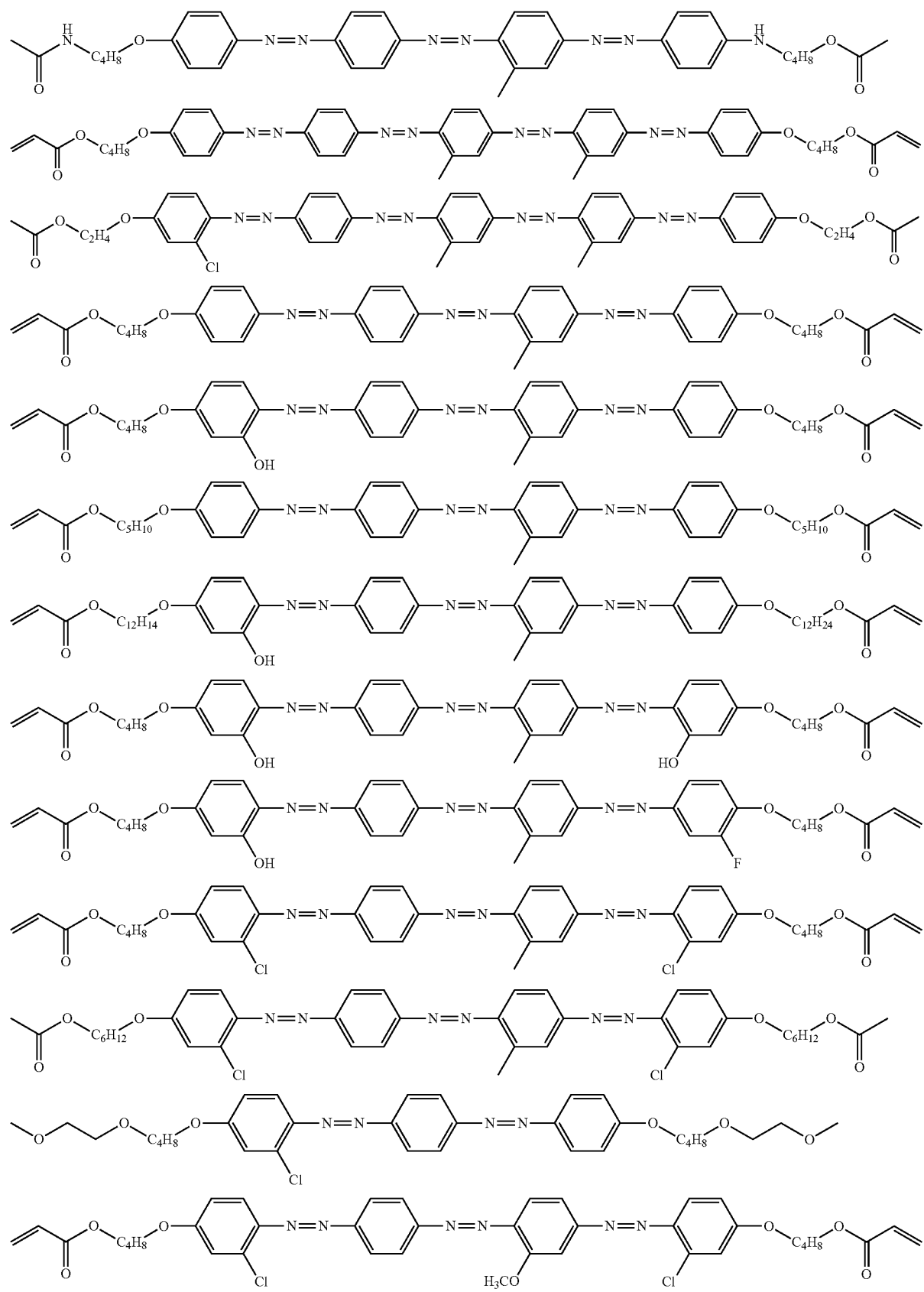

Specific other suitable examples of the first dichroic material include a dichroic dye compound having a structure represented by Formula (1M) (hereinafter, also referred to as a "dichroic dye compound (1M)").

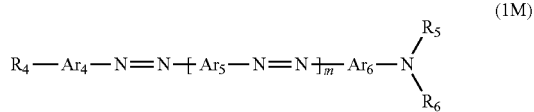

(1M)

In Formula (1M), m represents 1 or 2.

In Formula (1M), $Ar_4$, $Ar_5$, and $Ar_6$ each independently represent a phenylene group which may have a substituent, a naphthylene group which may have a substituent, or a heterocyclic group which may have a substituent.

The heterocyclic group may be aromatic or non-aromatic.

Examples of atoms other than the carbon atoms constituting the aromatic heterocyclic group include a nitrogen atom, a sulfur atom, and an oxygen atom. In a case where the aromatic heterocyclic group has a plurality of atoms constituting a ring other than carbon atoms, these may be the same as or different from each other.

Specific examples of the aromatic heterocyclic group include a pyridylene group (pyridine-diyl group), a pyridazine-diyl group, an imidazole-diyl group, thienylene group (thiophene-diyl group), a quinolylene group (quinoline-diyl group), an isoquinolylene group (isoquinolin-diyl group), an oxazole-diyl group, a thiazole-diyl group, an oxadiazole-diyl group, a benzothiazole-diyl group, a benzothiadiazole-diyl group, a phthalimide-diyl group, a thiazolothiazole-diyl group, and a thienothiophene-diyl group.

In Formula (1M), $R_4$ represents a hydrogen atom, a linear or branched alkyl group having 1 to 20 carbon atoms which may have a substituent, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, and an alkylsilyl group.

The carbon atoms of the alkyl group may be substituted with —O—, —CO—, —C(O)—O—, —O—C(O)—, —Si(CH$_3$)$_2$—O—Si(CH$_3$)$_2$—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —C≡C—, —N=N—, —C(R1')=CH—C(O)—, or —O—C(O)—O—.

In a case where $R_4$ represents a group other than a hydrogen atom, the hydrogen atom in each group may be substituted with a halogen atom, a nitro group, a cyano group, —N(R1')$_2$, an amino group, —C(R1')=C(R1')—NO$_2$, —C(R1')=C(R1')—CN, or —C(R1')=C(CN)$_2$.

R1' represents a hydrogen atom or a linear or branched alkyl group having 1 to 6 carbon atoms. In a case where a plurality of (R1')'s are present in each group, these may be the same as or different from one another.

In Formula (1M), $R_5$ and $R_6$ each independently represent a hydrogen atom, a linear or branched alkyl group having 1 to 20 carbon atoms which may have a substituent, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group.

The carbon atoms of the alkyl group may be substituted with —O—, —S—, —C(O)—, —C(O)—O—, —O—C(O)—, —C(O)—S—, —S—C(O)—, —Si(CH$_3$)$_2$—O—Si(CH$_3$)$_2$—, —NR2'—CO—, —CO—NR2'—, —NR2'—C(O)—O—, —O—C(O)—NR2'—, —NR2'—C(O)—NR2'—, —CH=CH—, —C≡C—, —N=N—, —C(R2')=CH—C(O)—, or —O—C(O)—O—.

In a case where $R_5$ and $R_6$ represent a group other than a hydrogen atom, the hydrogen atom of each group may be substituted with a halogen atom, a nitro group, a cyano group, a —OH group, —N(R2')$_2$, an amino group, —C(R2')=C(R2')—NO$_2$, —C(R2')=C(R2')—CN, or —C(R2')=C(CN)$_2$.

R2' represents a hydrogen atom or a linear or branched alkyl group having 1 to 6 carbon atoms. In a case where a plurality of (R2')'s are present in each group, these may be the same as or different from one another.

$R_5$ and $R_6$ may be bonded to each other to form a ring, or R2 or R3 may be bonded to Ar2 to form a ring.

From the viewpoint of the light fastness, it is preferable that $R_4$ represents an electron-withdrawing group, and it is preferable that $R_5$ and $R_6$ represent a group having a low electron-donating property.

Specific examples of such groups as $R_4$ include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and examples of such groups as $R_5$ and $R_6$ include groups having the following structures. In addition, the groups having the following structures are shown in the form having a nitrogen atom to which $R_5$ and $R_6$ are bonded in Formula (1M).

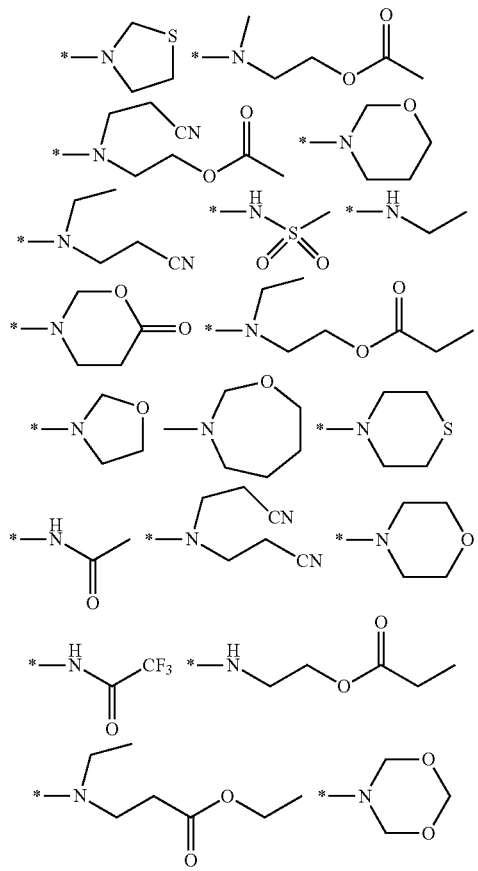

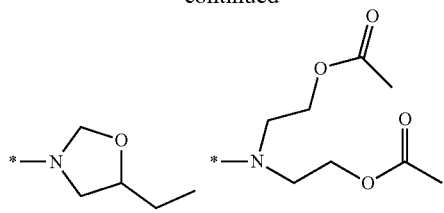
Specific examples of the dichroic dye compound (1M) are shown below, but the present invention is not limited thereto.
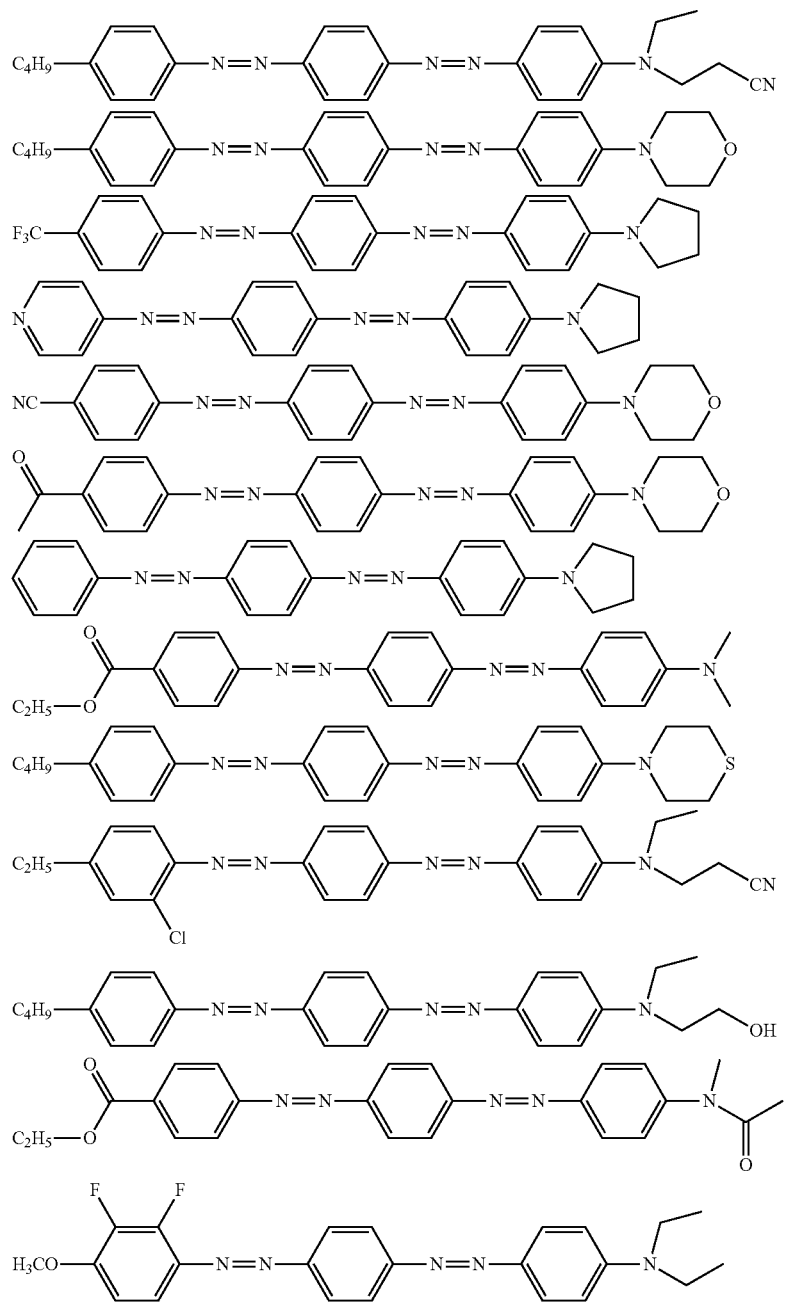

-continued
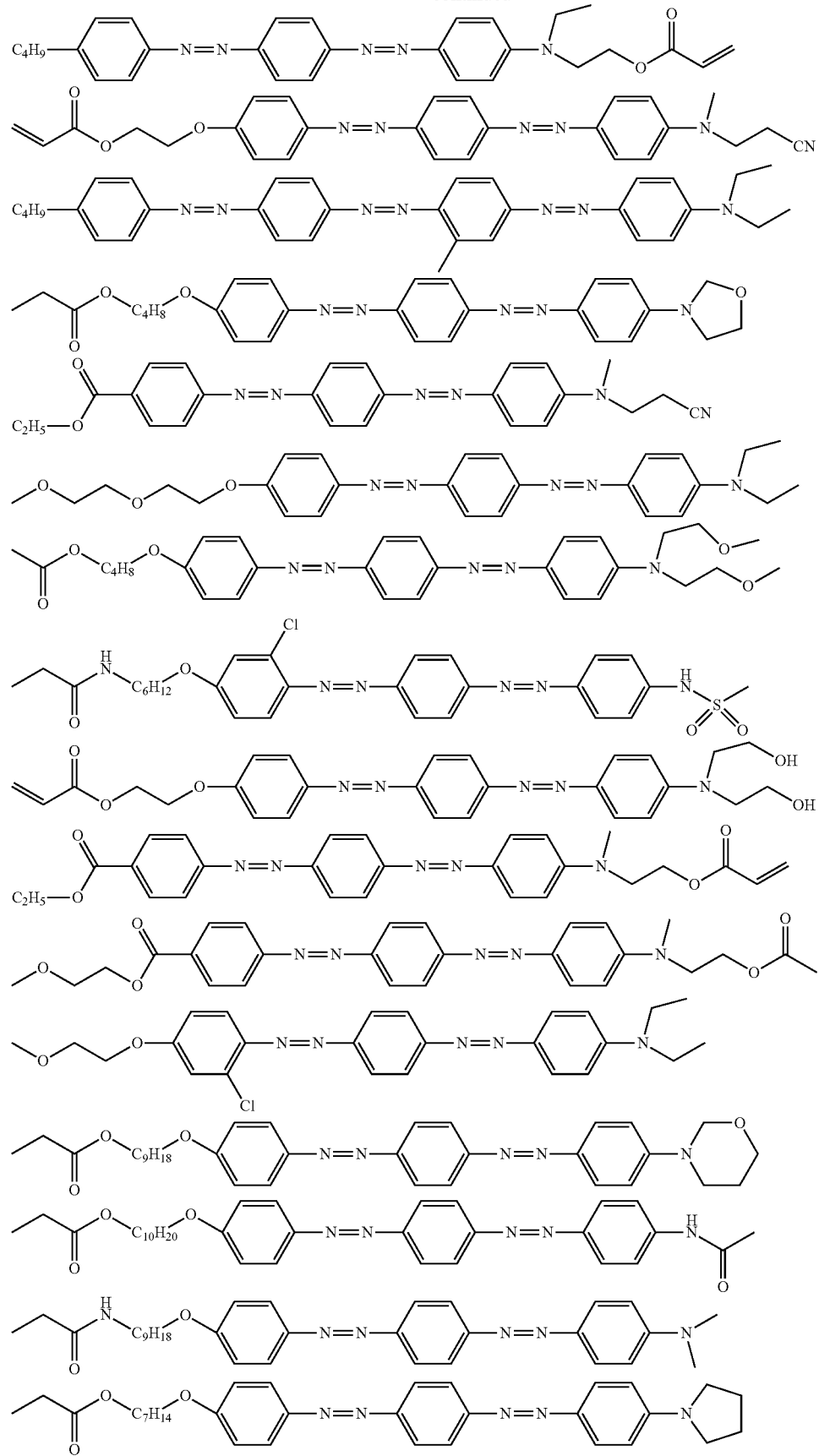

-continued

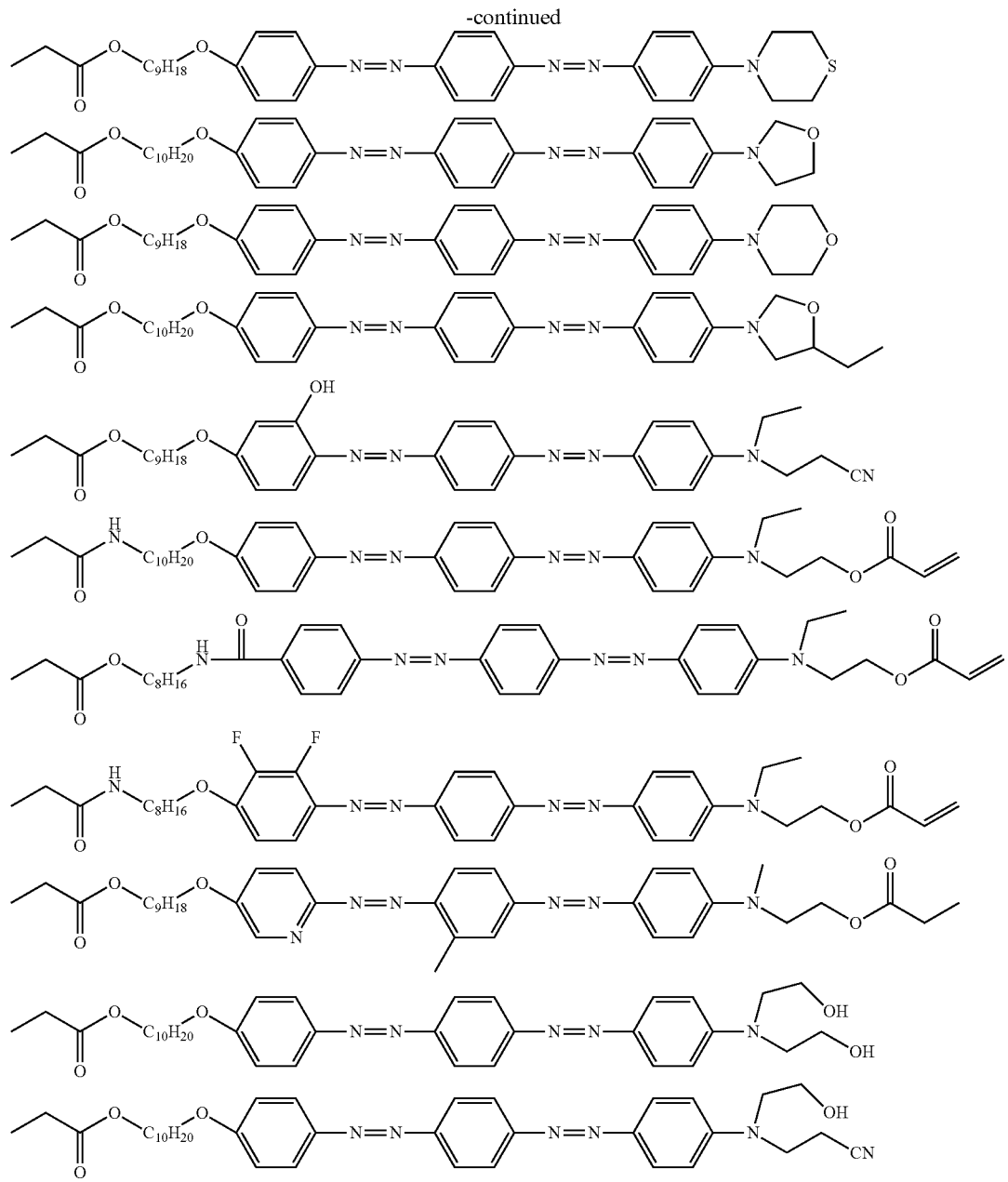

In the present invention, from the viewpoint of easily adjusting the tint of the polarizer, it is preferable that the first dichroic material contains a dichroic material having a maximum absorption wavelength in a range of 380 nm or greater and less than 455 nm (hereinafter, also referred to as a "dichroic material Y") and a dichroic material having a maximum absorption wavelength in a range of 455 nm or greater and less than 560 nm (hereinafter, also referred to as a "dichroic material M").

Here, the maximum absorption wavelength (nm) of the dichroic material is acquired from an ultraviolet visible spectrum in a wavelength range of 380 to 800 nm measured by a spectrophotometer using a solution prepared by dissolving the dichroic material in a good solvent.

Further, specific examples of the dichroic material Y include the above-described dichroic dye compound (1Y), and specific examples of the dichroic material M include the above-described dichroic dye compound (1M).

Further, in the present invention, from the viewpoint that the dichroic material Y is mere likely to be compatible with the liquid crystal compound, the log P value of the dichroic material Y is preferably 13 or less, more preferably 12 or less, and still more preferably 11 or less.

From the same viewpoint as described above, the log P value of the dichroic material M is preferably 9 or less and more preferably 7 or less.

<Second Dichroic Material>

The second dichroic material contained in the present composition is a dichroic material which is incompatible with the above-described liquid crystal compound.

Examples of such a second dichroic material include materials which are incompatible with the above-described liquid crystal compound among known dichroic materials of the related art, such as a visible light absorbing material (a dichroic dye), a light emitting material (a fluorescent material or a phosphorescent material), an ultraviolet absorbing material, an infrared absorbing material, a non-linear optical material, a carbon nanotube, and an inorganic material (for example, a quantum rod).

In the present invention, from the viewpoint of further improving the degree of alignment of the polarizer, it is preferable that the second dichroic material is a dichroic azo dye having a structure represented by Formula (2), and a difference between the log P value of the second dichroic material and the log P value of the liquid crystal compound is preferably 4.3 or greater.

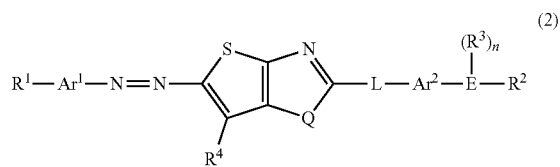

In Formula (2), $R^1$ and $R^2$ represent a substituent, and $R^3$ and $R^4$ each independently represent a hydrogen atom or a substituent.

In Formula (2), $Ar^1$ and $Ar^2$ each independently represent a divalent aromatic group which may have a substituent.

In Formula (2), E represents a single bond or any of a nitrogen atom, an oxygen atom, or a sulfur atom.

In Formula (2), Q represents an oxygen atom or a sulfur atom.

In Formula (2), L represents a single bond, —N=N—, —CR=N—, —CR=CR'—, or —C(=O)—NR—, R and R' each independently represent a hydrogen atom, a halogen atom, a cyano group, a nitro group, or an alkyl group having 1 to 6 carbon atoms.

In Formula (2), n represents 0 or 1. Here, n represents 0 in a case where E represents a single bond or any of an oxygen atom or a sulfur atom, and n represents 1 in a ease where E represents a nitrogen atom.

The "substituent" represented by $R^1$ and $R^2$ in Formula (2) will be described.

Examples of the substituent include a group having an electron-donating property or an electron-withdrawing property which is to be introduced to adjust the color tone of the dye and a group containing a crosslinkable group (polymerizable group) which is to be introduced to fix the alignment.

Examples of the substituent represented by $R^1$ include those exemplified as the substituent as $R_4$ in Formula M).

Examples of the substituent represented by $R^2$ include an alkyl group which may be substituted.

Suitable examples of the alkyl group include an alkyl group having 1 to 20 carbon atoms.

Here, the carbon atoms constituting the alkyl group may be substituted with —O—, —CO—, —C(O)—O—, —O—C(O)—, —Si(CH$_3$)$_2$—O—Si(CH$_3$)$_2$—, —N(R)—, —N(R)—CO—, —CO—N(R)—, —N(R)—C(O)—O—, —O—C(O)—N(R)—, —N(R)—C(O)—N(R')—, —CH=CH—, —C≡C—, —N=N—, —C(R)=N—, —C(R)=CH—C(O)—, or —O—C(O)—O—, R and R' represent an alkyl group and preferably an alkyl group having 1 to 10 carbon atoms.

The hydrogen atom bonded to the carbon atom of the alkyl group may be substituted with a halogen atom, a nitro group, a cyano group, —N(R)(R')—, an amino group, —C(R)=C(R)—NO$_2$, —C(R)=C(R')—CN, or —C(R)=C(CN)$_2$. R and R' represent an alkyl group and preferably an alkyl group having 1 to 10 carbon atoms.

The "hydrogen atom or substituent" represented by $R^3$ and $R^4$ in Formula (2) will be described.

Here, examples of the "substituent" represented by one embodiment of $R^3$ and $R^4$ include those exemplified as the "substituent" represented by $R^2$ in Formula (2). In a case where $R^3$ represents a substituent, $R^3$ may be linked to $R^2$ to form a ring structure.

The "divalent aromatic group which may have a substituent" represented by $Ar^1$ and $Ar^2$ in Formula (2) will be described.

Examples of the substituent include the substituent group G described in paragraphs to [0240] of JP2011-237513A. Among these, a halogen atom, an alkyl group, an alkoxy group, an all oxycarbonyl group (such as methoxycarbonyl or ethoxycarbonyl), and an aryloxycarbonyl group (such as phenoxycarbonyl, 4-methylphenoxycarbonyl, or 4-methoxyphenylcarbonyl) are suitable, an alkyl group is more suitable, and an alkyl group having 1 to 5 carbon atoms is still more suitable.

Meanwhile, examples of the divalent aromatic group include a divalent aromatic hydrocarbon group and a divalent aromatic heterocyclic group.

Examples of the divalent aromatic hydrocarbon group include an arylene group having 6 to 12 carbon atoms, and specific examples thereof include a phenylene group, a cumenylene group, a mesitylene group, a tolylene group, and a xylylene group. Among these, a phenylene group is preferable.

Further, a group derived from a monocycle or a bicyclic heterocycle is preferable as the divalent aromatic heterocyclic group. Examples of atoms other than the carbon atoms constituting the aromatic heterocyclic group include a nitrogen atom, a sulfur atom, and an oxygen atom. In a case where the aromatic heterocyclic group has a plurality of atoms constituting a ring other than carbon atoms, these may be the same as or different from each other. Specific examples of the aromatic heterocyclic group include a pyridylene group (pyridine-diyl group), a quinolylene group (quinoline-diyl group), an isoquinolylene group (isoquinoline-diyl group), a benzothiadiazole-diyl group, a phthalimido-diyl group, and a thienothiazole-diyl group (hereinafter, also referred to as a "thienothiazole group").

Among the divalent aromatic groups described above, a divalent aromatic hydrocarbon group is preferable.

In Formula (2), E represents a single bond or any of a nitrogen atom, an oxygen atom, or a sulfur atom as described above and preferably a single bond or a nitrogen atom.

In Formula (2), Q represents an oxygen atom or a sulfur atom as described above and preferably a sulfur atom.

In Formula (2), as described above, L represents a single bond, —N=N—, —CR=N—, —CR=CR'—, or —C(=O)—NR—, and R and R' each independently represent a hydrogen atom, a halogen atom, a cyano group, a nitro group, or an alkyl group having 1 to 6 carbon atoms. Among these, —N=N— or —C(=O)—NH— is preferable.

Specific examples of the dichroic azo dye having a structure represented by Formula (2) are shown below, but the present invention is not limited thereto.

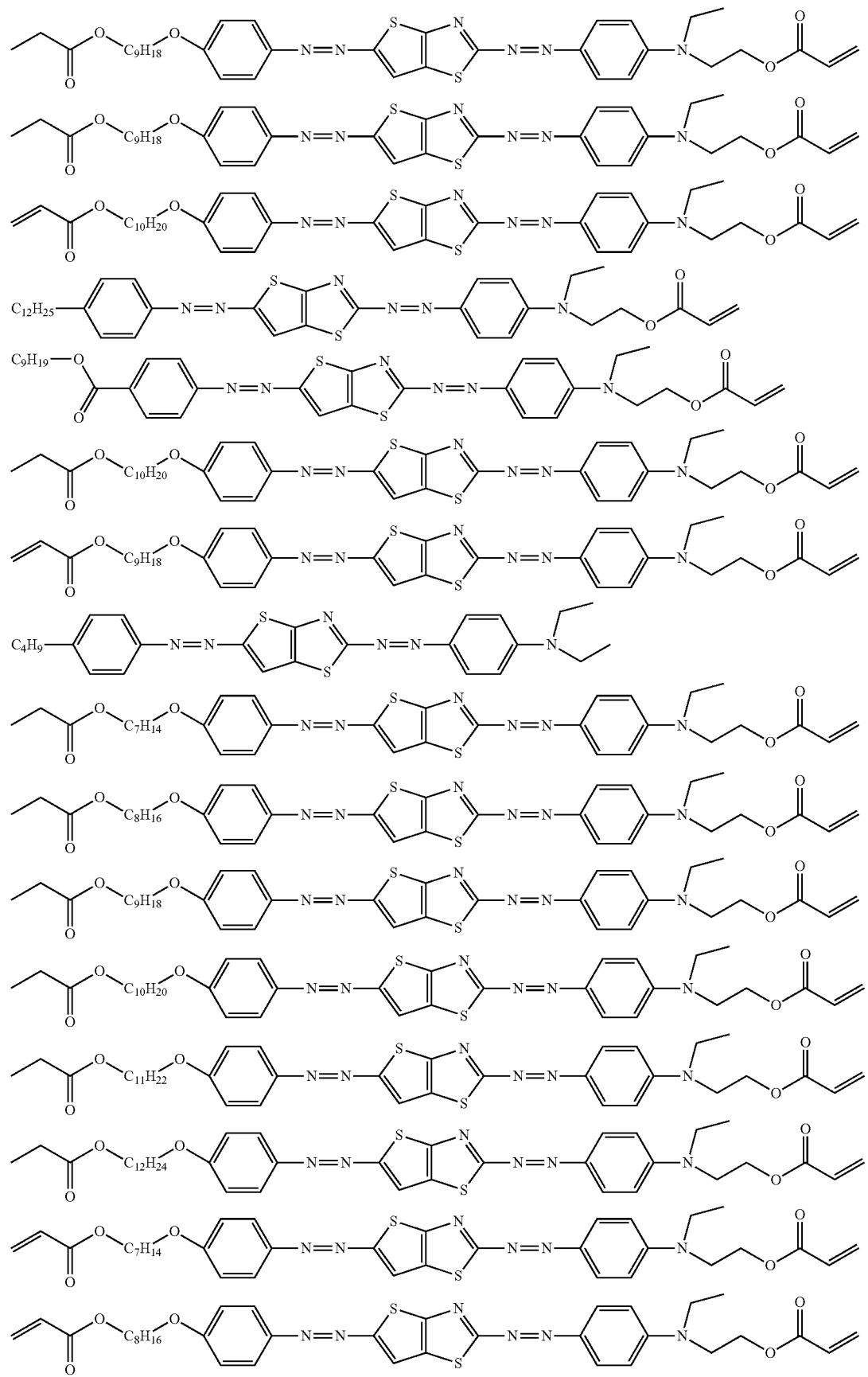

-continued
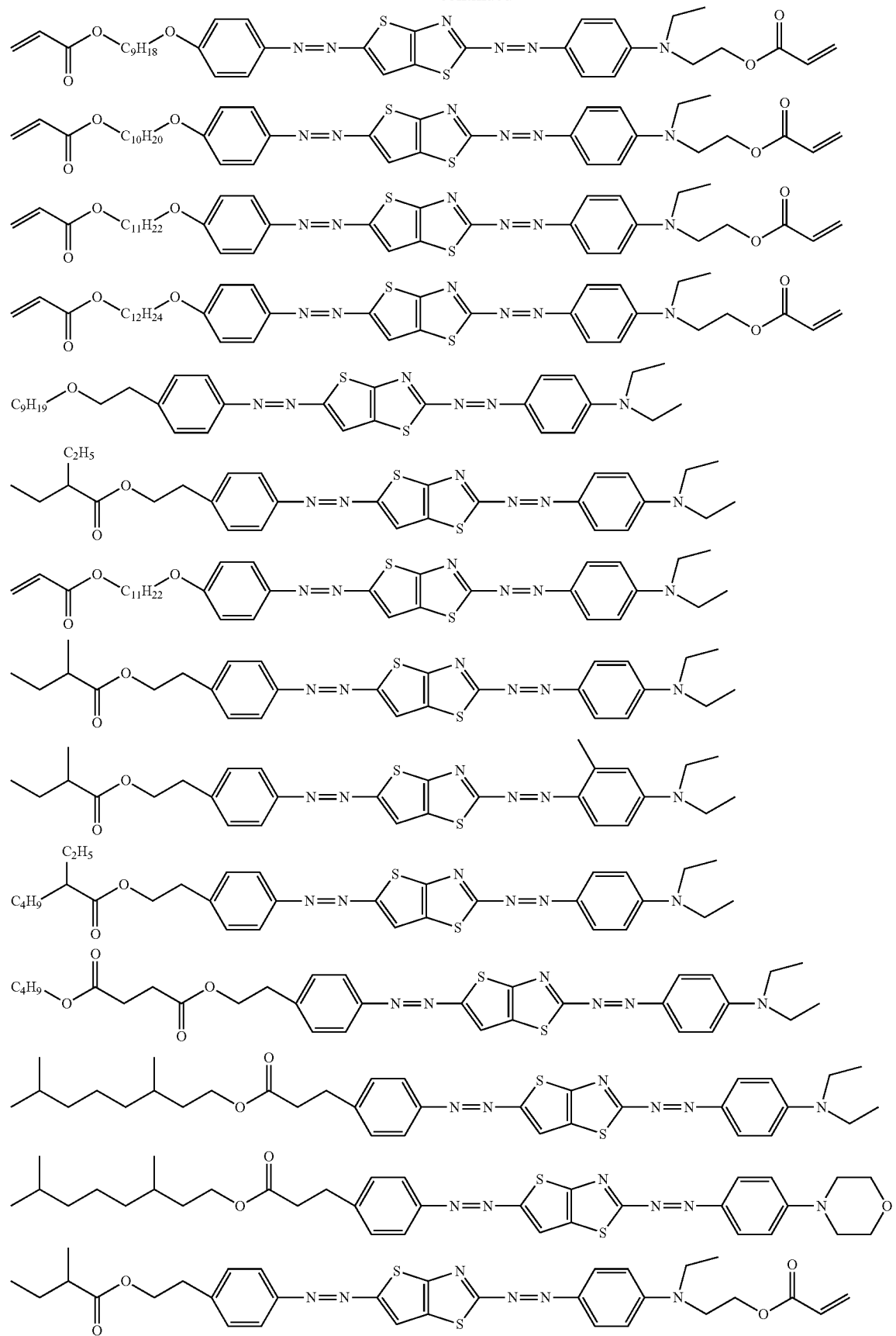

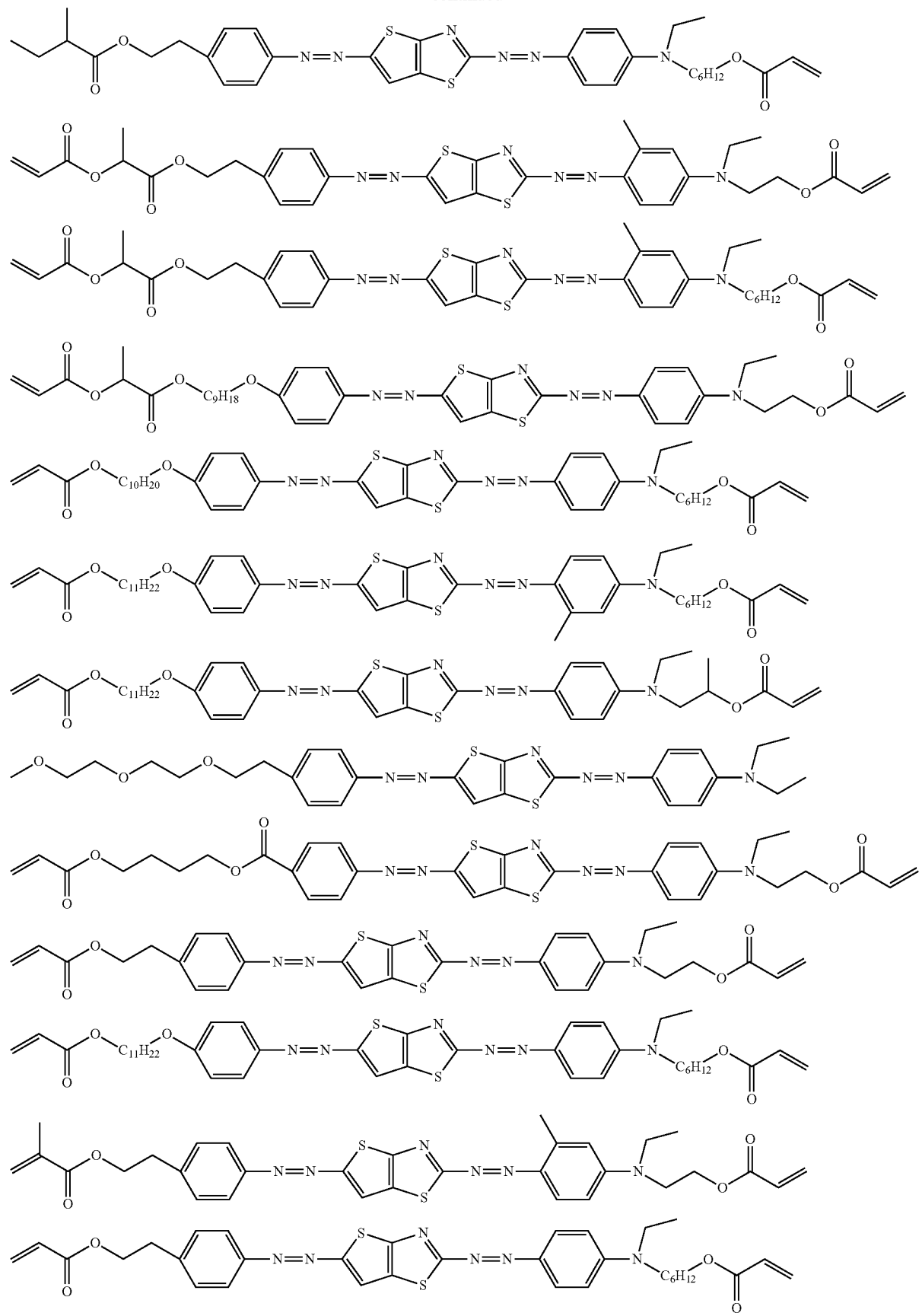

-continued

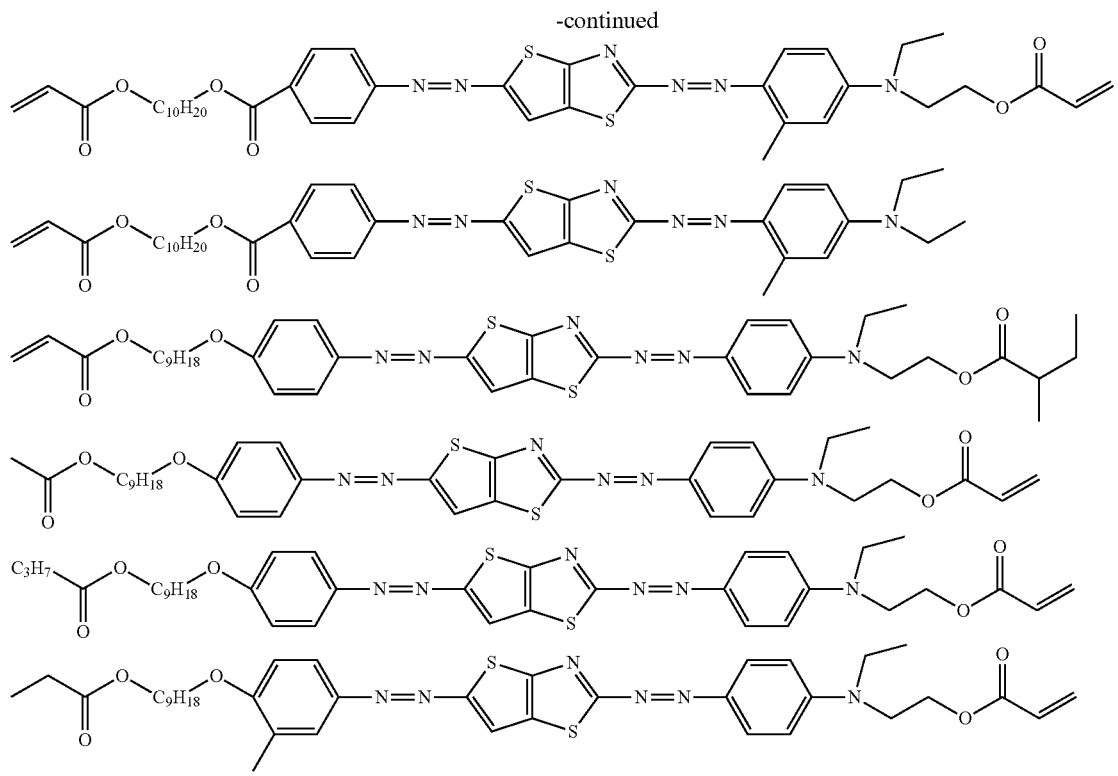

In the present invention, the viewpoint of easily adjusting the tint of the polarizer, it is preferable that any one of the first dichroic material or the second dichroic material is the dichroic material Y having a maximum absorption wavelength in a range of 380 nm or greater and less than 455 nm and more preferable that the first dichroic material is the dichroic material Y.

Further, in the present invention, from the viewpoint of easily adjusting the tint of the polarizer, it is preferable that any one of the first dichroic material or the second dichroic material is a dichroic material having a maximum absorption wavelength in a range of 560 nm to 700 nm (hereinafter, also referred to as a "dichroic material C") and more preferable that the second dichroic material is the dichroic material C.

Further, in the present invention, from the viewpoint that the dichroic material C is unlikely to be compatible with the liquid crystal compound, the log P value of the dichroic material C is preferably 8 or greater and more preferably 10 or greater.

(Content of Dichroic Material)

The total content of the first dichroic material and the second dichroic material in the present composition is preferably in a range of 1 to 50 parts by mass, more preferably in a range of 5 to 40 parts by mass, and particularly preferably in a range of 8 to 30 parts by mass with respect to 100 parts by mass of the liquid crystal compound.

Further, the content of the first dichroic material is preferably in a range of 0.5 to 35 parts by mass and more preferably in a range of 1 to 25 parts by mass with respect to 100 parts by mass of the liquid crystal compound.

Further, the content of the second dichroic material is preferably in a range of 1 to 30 parts by mass and more preferably in a range of 2 to 20 parts by mass with respect to 100 parts by mass of the liquid crystal compound.

<Solvent>

From the viewpoint of workability and the like, it is preferable that the present composition contains a solvent.

Examples of the solvent include organic solvents such as ketones (such as acetone, 2-butanone, methyl isobutyl ketone, cyclopentanone, and cyclohexanone), ethers such as dioxane, tetrahydrofuran, tetrahydropyran, dioxolane, tetrahydrofurfuryl alcohol, and cyclopentyl methyl ether), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane (chloroform), dichloroethane, dichlorobenzene, and chlorotoluene), esters (such as methyl acetate, ethyl acetate, butyl acetate, and diethyl carbonate), alcohols (such as ethanol, isopropanol, butanol, and cyclohexanol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, N-ethylpyrrolidone, and 1,3-dimethyl-2-imidazolidinone), and heterocyclic compounds (such as pyridine), and water. These solvents may be used alone or in combination of two or more kinds thereof.

Among these solvents, it is preferable to use an organic solvent and more preferable to use halogenated carbons or ketones from the viewpoint that the effects of the present invention are more excellent.

In a case where the present composition contains a solvent, the content of the solvent is preferably in a range of 70% to 99.5% by mass, more preferably in a range of 80% to 99% by mass, and still more preferably in a range of 85% to 98% by mass with respect to the total mass of the present composition from the viewpoint that the effects of the present invention are more excellent.

<Interface Modifier>

It is preferable that the present composition contains an interface modifier. In a case where the composition contains an interface modifier, the smoothness of the coated surface is improved, the degree of alignment is improved, and cissing and unevenness are suppressed so that the in-plane uniformity is expected to be improved.

As the interface modifier, interface modifiers that allow liquid crystal compounds to be horizontally aligned are preferable, and compounds (horizontal alignment agents) described in paragraphs [0253] to [0293] of JP2011-237513A can be used. Further, fluorine (meth)acrylate-based polymers described in [0018] to [0043] of JP2007-272185A can also be used. Compounds other than the compounds described above may be used as the interface modifier.

In a case where the present composition of the present invention contains an interface modifier, from the viewpoint that the effects of the present invention are more excellent, the content of the interface modifier is preferably in a range of 0.001 to 5 parts by mass and more preferably in a range of 0.01 to 3 parts by mass with respect to 100 parts by mass which is the total of the liquid crystal compound and the dichroic materials in the present composition.

<Polymerization Initiator>

From the viewpoint that the effects of the present invention are more excellent, it is preferable that the present composition contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661 A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), and acylphosphine oxide compounds (JP1988-040799B (JP-S63-040799B), JP1993-029234B (JP-H05-029234B), JP1998-095788A (JP-H10-095788A), and JP1998-029997A (JP-H10-029997A)).

Commercially available products can also be used as such a photopolymerization initiator, and examples thereof include IRGACURE 184, IRGACURE 907, IRGACURE 369, IRGACURE 651, IRGACURE 819, and IRGACURE OXE-01 (all manufactured by BASF SE).

In a case where the present composition contains a polymerization initiator, from the viewpoint that the effects of the present invention are more excellent, the content of the polymerization initiator is preferably in a range of 0.01 to 30 parts by mass and more preferably in a range of 0.1 to 15 parts by mass with respect to 100 parts by mass which is the total of the liquid crystal compound and the dichroic materials in the present composition. The durability of the polarizer is excellent in a case where the content of the polymerization initiator is 0.01 parts by mass or greater, and the alignment of the polarizer is more excellent in a case where the content of the polymerization initiator is 30 parts by mass or less.

[Method of Producing Polarizer]

The method of producing the polarizer according to the embodiment of the present invention is not particularly limited, but a method comprising a step of forming a coating film by coating an alignment film with the above-described present composition (hereinafter, also referred to as a "coating film forming step") and a step of aligning a dichroic material contained in the coating film (hereinafter, also referred to as an "aligning step") in this order (hereinafter, also referred to as the "present production method") is preferable from the viewpoint that the degree of alignment of the polarizer to be obtained is increased. Hereinafter, "the degree of alignment of the polarizer to be obtained is increased" will also be referred to as "the effects of the present invention are more excellent".

Hereinafter, each step will be described.

<Coating Film Forming Step>

The coating film forming step is a step of forming a coating film by coating the alignment film with the above-described present composition. The liquid crystal compound in the coating film is horizontally aligned due to an interaction between the alignment film and an interface modifier (in a case where the present composition contains an interface modifier).

The alignment film can be easily coated with the present composition of the present invention by using the present composition of the present invention which contains the above-described solvent or using a liquid such as a melt obtained by heating the present composition of the present invention.

Examples of the method of coating the film with the present composition include known methods such as a roll coating method, a gravure printing method, a spin coating method, a wire bar coating method, an extrusion coating method, a direct gravure coating method, a reverse gravure coating method, a die-coating method, a spraying method, and an ink jet method.

(Alignment Film)

An alignment film may be any film as long as the film allows the liquid crystal compound contained in the present composition to be horizontally aligned.

An alignment film can be provided by means such as a rubbing treatment performed on a film surface of an organic compound (preferably a polymer), oblique vapor deposition of an inorganic compound, formation of a layer having microgrooves, or accumulation of an organic compound (such as ω-tricosanoic acid, dioctadecylmethylammonium chloride, or methyl stearylate) according to a Langmuir-Blodgett method (LB film). Further, an alignment film in which an orientation function is generated by application of an electric field, application of a magnetic field, or irradiation with light is also known. Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(1) Rubbing Treatment Alignment Film

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 1 μm.

(2) Photo-Alignment Film

A photo-alignment material used for an alignment film formed by irradiation with light is described in a plurality of documents. In the present invention, preferred examples thereof include azo compounds described in JP2006-285197A, JP2007-076839A, JP2007-138138A, JP2007-094071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, photocrosslinkable polyimides, polyamides, or esters described in JP2003-520878A, JP2004-529220A, and JP4162850B. Among these, azo compounds, photocrosslinkable polyimides, polyamides, or esters are more preferable.

The photo-alignment film formed of the above-described material is irradiated with linearly polarized light or non-polarized light to produce a photo-alignment film.

In this specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, or a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic material polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0° to 90° (vertical) and more preferably in a range of 40° to 90°.

In a case where light to be applied is non-polarized light, the alignment film is irradiated with non-polarized light obliquely. The incidence angle is preferably in a range of 10° to 80°, more preferably in a range of 20° to 60°, and still more preferably in a range of 30° to 50°.

The irradiation time is preferably in a range of minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

<Aligning Step>

The aligning step is a step of horizontally aligning the first dichroic material and the second dichroic material contained in the coating film. In this manner, the polarizer according to the embodiment of the present invention is obtained. In the aligning step, the first dichroic material and the second dichroic material are considered to be aligned along the liquid crystal compound horizontally aligned by the alignment film.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the dichroic material contained in the present composition may be aligned by performing the above-described coating film forming step or drying treatment. For example, in an embodiment in which the present composition is prepared as a coating solution containing a solvent, the polarizer according to the embodiment of the present invention may be obtained by drying the coating film and removing the solvent from the coating film so that the first dichroic material and the second dichroic material contained in the coating film are aligned.

It is preferable that the aligning step includes a heat treatment. In this manner, the first dichroic material and the second dichroic material contained in the coating film are further aligned, and thus the degree of alignment of the polarizer to be obtained is further increased.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the first dichroic material and the second dichroic material contained in the coating film is further fixed, and thus the degree of alignment of the polarizer to be obtained is further increased. The cooling means is not particularly limited and can be performed according to a known method.

The polarizer according to the embodiment of the present invention can be obtained by performing the above-described steps.

<Other Steps>

The present production method described below may include a step of curing the polarizer after the aligning step (hereinafter, also referred to as a "curing step").

The curing step is performed by, for example, heating the film and/or irradiating (exposing) the film with light. Between these, it is preferable that the curing step is performed by irradiating the film with light.

Various light sources such as infrared rays, visible light, and ultraviolet rays can be used as the light source for curing, but ultraviolet rays are preferable. In addition, ultraviolet rays may be applied while the film is heated during curing, or ultraviolet rays may be applied through a filter that transmits only a specific wavelength.

Further, the exposure may be performed under a nitrogen atmosphere. In a case where the curing of the polarizer proceeds by radical polymerization, from the viewpoint of reducing inhibition of polymerization by oxygen, it is preferable that exposure is performed in a nitrogen atmosphere.

[Laminate]

The laminate of the present invention includes a base material, an alignment film provided on the base material, and the above-described polarizer according to the embodiment of the present invention provided on the alignment film.

Further, the laminate of the present invention may include a $\lambda/4$ plate on the polarizer according to the embodiment of the present invention.

Further, the laminate of the present invention may include a barrier layer between the polarizer according to the embodiment of the present invention and the $\lambda/4$ plate.

Hereinafter, each layer constituting the laminate of the present invention will be described.

[Base Material]

The base material can be appropriately selected, and examples thereof include glass and a polymer film. The light transmittance of the base material is preferably 80% or greater.

In a case where a polymer film is used as the base material, it is preferable to use an optically isotropic polymer film. As specific examples and preferred embodiments of the polymer, the description in paragraph [0013] of JP2002-022942A can be applied. Further, even in a case of a polymer easily exhibiting the birefringence such as polycarbonate and polysulfone which has been known in the related art, a polymer with the exhibiting property which has been decreased by modifying the molecules described in WO2000/026705A can be used.

[Alignment Film]

The alignment film is as described above, and thus the description thereof will not be repeated.

[Polarizer]

The polarizer according to the embodiment of the present invention is as described above, and thus the description will not be repeated.

[$\lambda/4$ plate]

A "$\lambda/4$ plate" is a plate having a $\lambda/4$ function, specifically, a plate having a function of converting linearly polarized light having a specific wavelength into circularly polarized light (or converting circularly polarized light into linearly polarized light).

For example, specific examples of a form in which a $\lambda/4$ plate has a single-layer structure include a stretched polymer film and a phase difference film in which an optically anisotropic layer having $\lambda/4$ function is provided on a support. Further, specific examples of a form in which a $\lambda/4$ plate has a multilayer structure include a broadband $\lambda/4$ plate obtained by laminating a $\lambda/4$ plate and a $\lambda/2$ plate.

The $\lambda/4$ plate and the polarizer according to the embodiment of the present invention may be provided by coming into contact with each other, or another layer may be provided between the $\lambda/4$ plate and the polarizer according to the embodiment of the present invention. Examples of such a layer include a pressure sensitive adhesive layer or an adhesive layer for ensuring the adhesiveness, and a barrier layer.

[Barrier Layer]

In a case where the laminate of the present invention comprises a barrier layer, the barrier layer is provided between the polarizer according to the embodiment of the present invention and the $\lambda/4$ plate. Further, in a case where a layer other than the barrier layer (for example, a pressure sensitive adhesive layer or an adhesive layer) is comprised between the polarizer according to the embodiment of the present invention and the $\lambda/4$ plate, the barrier layer can be provided, for example, between the polarizer according to the embodiment of the present invention and the layer other than the barrier layer.

The barrier layer is also referred to as a gas barrier layer (oxygen barrier layer) and has a function of protecting the polarizer according to the embodiment of the present invention from gas such as oxygen in the atmosphere, the moisture, or the compound contained in an adjacent layer.

The barrier layer can refer to, for example, the description in paragraphs [0014] to [0051] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A.

[Applications]

The laminate of the present invention can be used as a polarizing element (polarizing plate) or the like, for example, as a linear polarizing plate or a circularly polarizing plate.

In a case where the laminate of the present invention does not include an optically anisotropic layer such as the $\lambda/4$ plate, the laminate can be used as a linear polarizing plate.

Meanwhile, in a case where the laminate of the present invention includes the $\lambda/4$ plate, the laminate can be used as a circularly polarizing plate.

[Image Display Device]

An image display device according to the embodiment of the present invention includes the above-described polarizer according to the embodiment of the present invention or the above-described laminate of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable, and a liquid crystal cell is more preferable. That is, in the image display device of the present invention, a liquid crystal display device obtained by using a liquid crystal cell as a display element or an organic EL display device obtained by using an organic EL display panel as a display element is preferable, and a liquid crystal display device is more preferable.

[Liquid Crystal Display Device]

As a liquid crystal display device which is an example of the image display device according to the embodiment of the present invention, a form of a liquid crystal display device including the above-described polarizer according to the embodiment of the present invention and a liquid crystal cell is preferably exemplified. A liquid crystal display device including the above-described laminate of the present invention (here, the laminate does not include a $\lambda/4$ plate) and a liquid crystal cell is more suitable.

In the present invention, between the polarizing elements provided on both sides of the liquid crystal cell, it is preferable that the laminate of the present invention is used as a front-side polarizing element and more preferable that the laminate of the present invention is used as a front-side polarizing element and a rear-side polarizing element.

Hereinafter, the liquid crystal cell constituting the liquid crystal display device will be described in detail.

<Liquid Crystal Cell>

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules are substantially horizontally aligned at the time of no voltage application and further twisted aligned at 60° to 120°. The liquid crystal cell in a TN mode is most likely used as a color thin film transistor (TFT) liquid crystal display device and is described in multiple documents.

In the liquid crystal cell in a VA mode, rod-like liquid crystal molecules are substantially vertically aligned at the time of no voltage application. The concept of the liquid crystal cell in a VA mode includes (1) a liquid crystal cell in a VA mode in a narrow sense where rod-like liquid crystal molecules are aligned substantially vertically at the time of no voltage application and substantially horizontally at the time of voltage application (described in JP1990-176625A (JP-H02-76625A)), (2) a liquid crystal cell (in an MVA mode) (SID97, described in Digest of tech. Papers (proceedings) 28 (1997) 845) in which the VA mode is formed to have multi-domain in order to expand the viewing angle, (3) a liquid crystal cell in a mode (n-ASM mode) in which rod-like liquid crystal molecules are substantially vertically aligned at the time of no voltage application and twistedly multi-domain aligned at the time of voltage application (described in proceedings of Japanese Liquid Crystal Conference, p. 58 to 59 (1998)), and (4) a liquid crystal cell in a SURVIVAL mode (presented at LCD International 98). Further, the liquid crystal cell may be of any of a patterned vertical alignment (PVA) type, a photo-alignment (optical alignment) type, and a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-054982A (JP-H10-054982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

As an organic EL display device which is an example of the image display device according to the embodiment of the present invention, a form of a display device including the above-described polarizer according to the embodiment of the present invention, a λ/4 plate, and an organic EL display panel in this order from the viewing side is suitably exemplified.

A form of a display device including the above-described laminate of the present invention which includes a λ/4 plate and an organic EL display panel in this order from the viewing side is more suitably exemplified. In this case, the laminate is formed such that a base material, an alignment film, the polarizer according to the embodiment of the present invention, a barrier layer provided as necessary, and a λ/4 plate are disposed in this order from the viewing side.

Further, the organic EL, display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Example 1

<Preparation of Alignment Film>

A glass base material (manufactured by Central Glass Co., Ltd., blue plate glass, size of 300 mm×300 mm, thickness of 1.1 mm) was washed with an alkaline detergent, pure water was poured thereinto, and the glass base material was dried.

The dried glass base material was coated with the following composition 1 for forming an alignment film using a #12 wire bar, and the applied composition 1 for forming an alignment film was dried at 110° C. for 2 minutes to form a coating film on the glass base material.

The obtained coating film was subjected to a rubbing treatment (roller rotation speed: 1000 rotations/spacer thickness of 2.9 nm, stage speed of 1.8 m/min) once to prepare an alignment film 1 on the glass base material.

| Composition of composition 1 for forming alignment film | |
|---|---|
| Modified vinyl alcohol (PVA-1 shown below): | 2.00 parts by mass |
| Water: | 74.08 parts by mass |
| Methanol | 23.86 parts by mass |
| Photopolymerization initiator (IRGACURE 2959, manufactured by BASF SE): | 0.06 parts by mass |

PVA-1

<Preparation of Polarizer>

The obtained alignment film 1 was cut into a size of 30 mm×30 mm and spin-coated with the following polarizer-forming composition 1 at 1000 rotations to form a coating film.

The coating film was dried at room temperature for 30 seconds and further heated at 150° C. for 15 seconds.

Next, the coating film was cooled to room temperature, heated to 80° C., and cooled to room temperature, thereby preparing a polarizer 1 on the alignment film 1.

| Composition of polarizer-forming composition 1 |
|---|
| Liquid crystal compound (L1 shown below): 5.859 parts by mass |
| First dichroic material (Y1 shown below): 0.293 parts by mass |
| Second dichroic material (C1 shown below): 0.792 parts by mass |
| Interface modifier (F1 shown below): 0.056 parts by mass |
| Chloroform: 93 parts by mass |

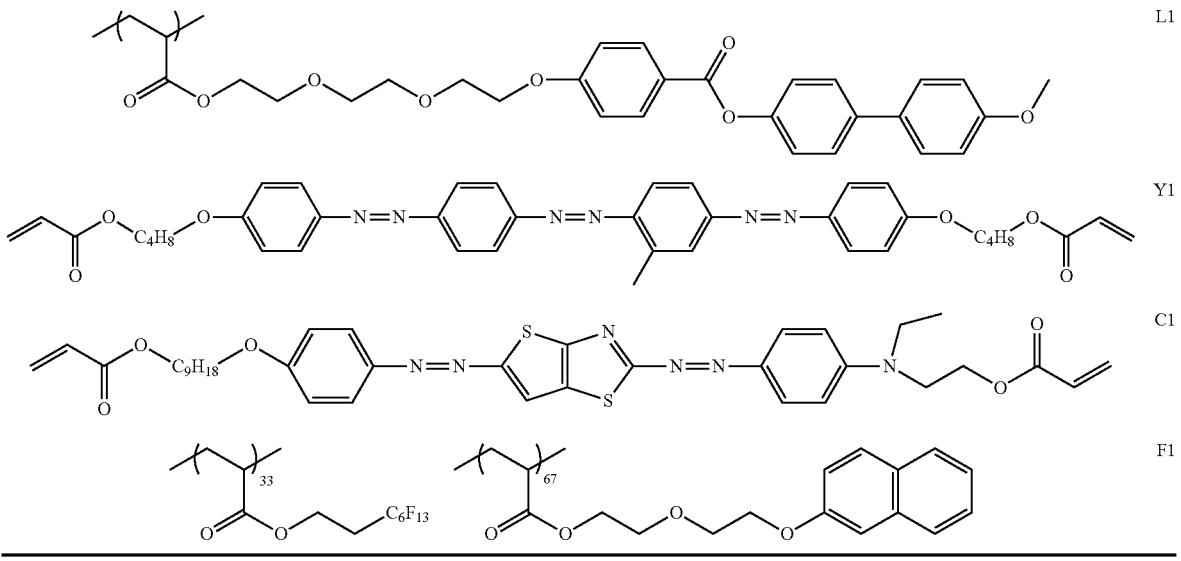

Examples 2 to 11, Comparative Examples 1 to 3, and Reference Example 1

Each polarizer was prepared according to the same procedure as in Example 1 except that the polarizer-forming composition with the composition listed in Table 1 was used in place of the polarizer-forming composition 1.

Further, the components used in each example including Example 1 are collectively shown below.

Further, the compatibility between the liquid crystal compound and the first dichroic material or the second dichroic material in the polarizer-forming composition was confirmed by the method described above, and the results thereof are listed in Table 1.

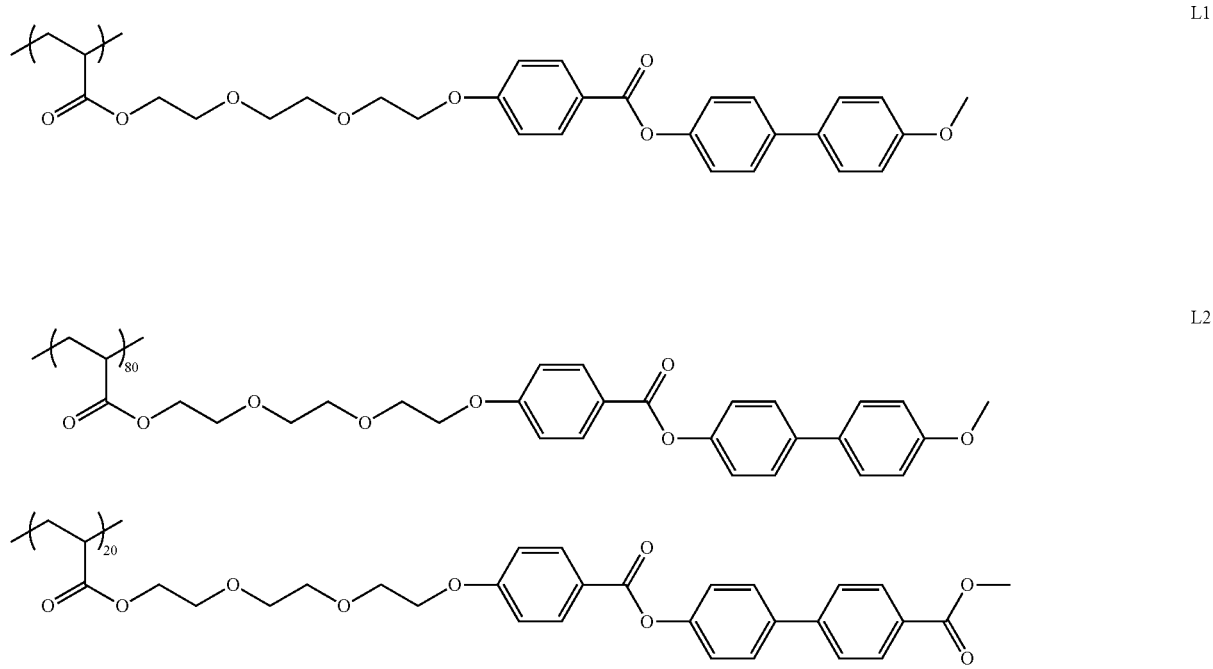

-continued
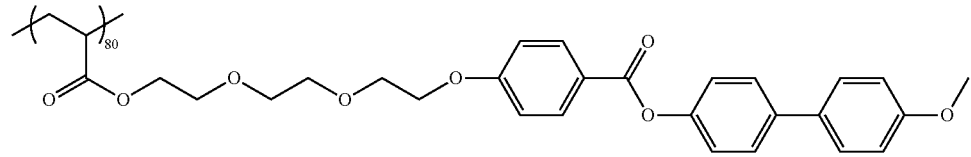
L3
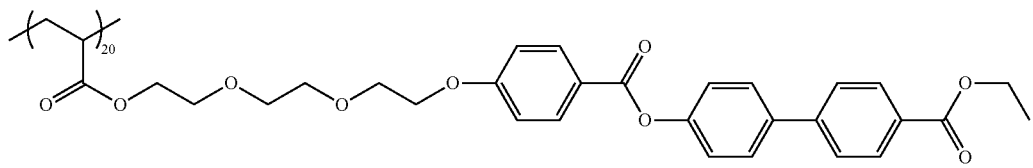
L4
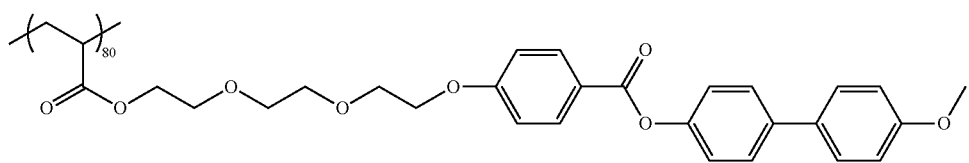
L5
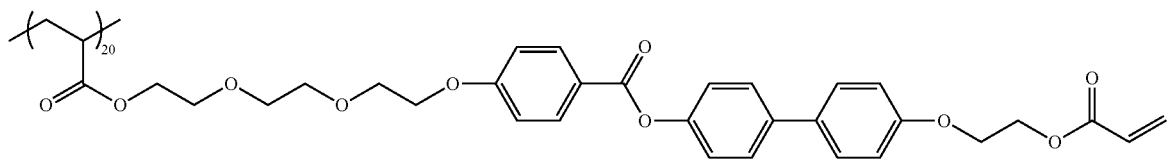
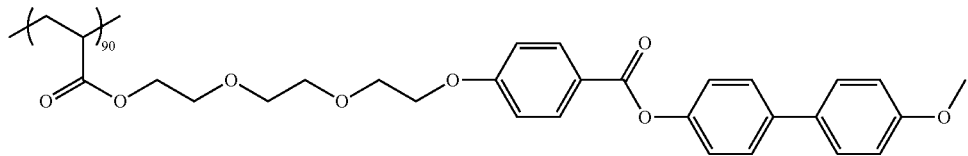
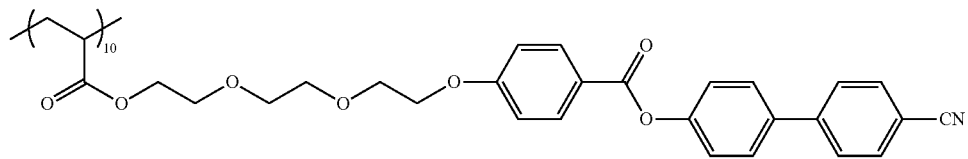
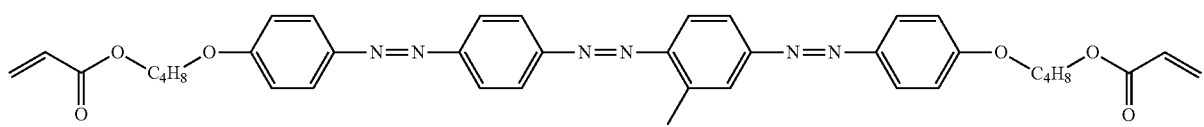
Y1
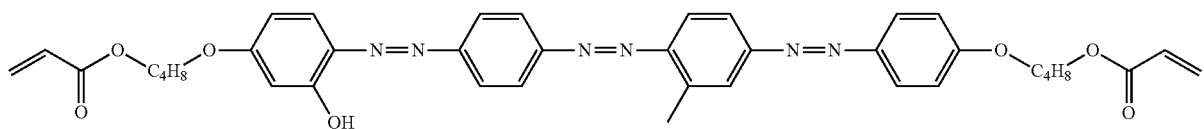
Y2
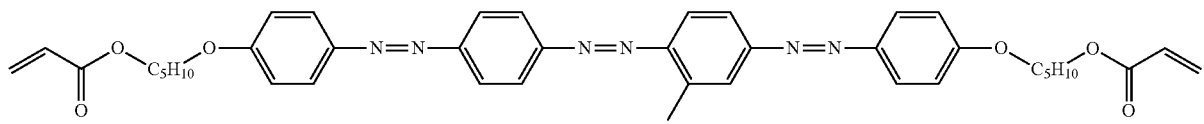
Y3

-continued
Y4
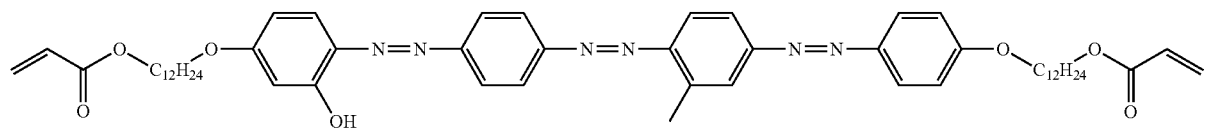
Y5
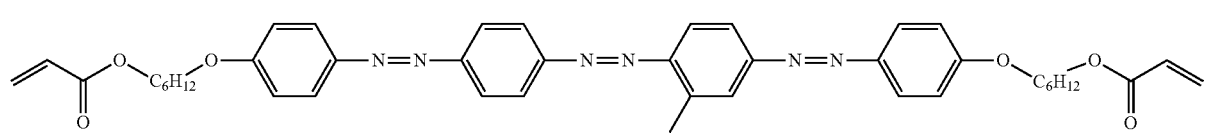
Y6
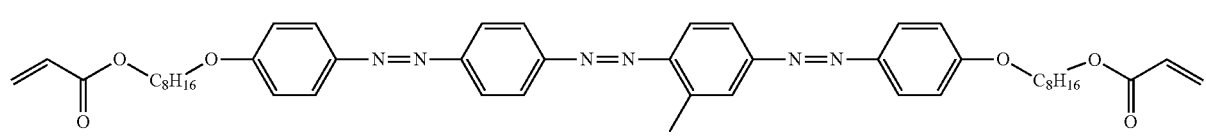
Y7
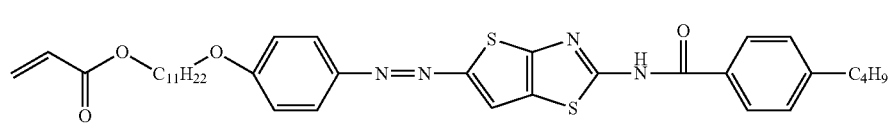
Y8
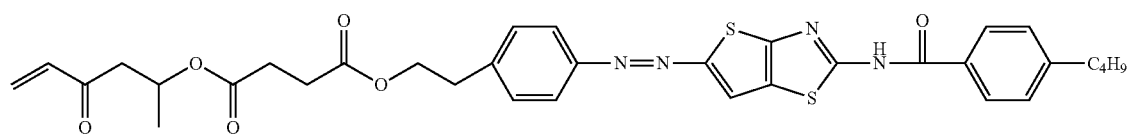
M1
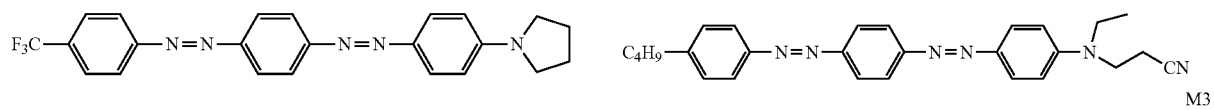
M2
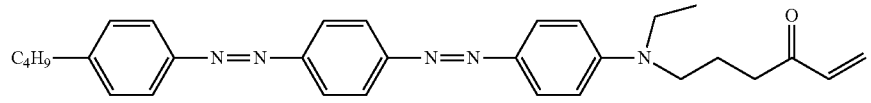
M3
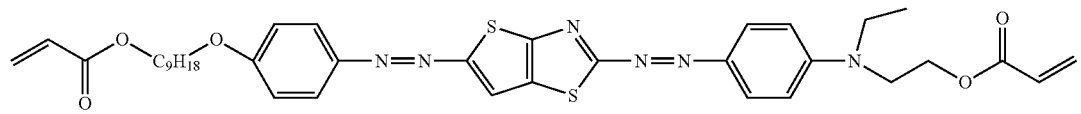
C1
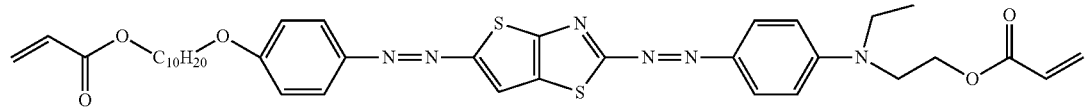
C2
C3
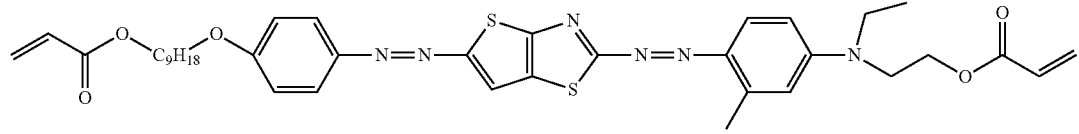
C4
C5
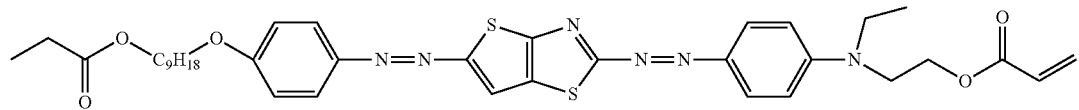

-continued

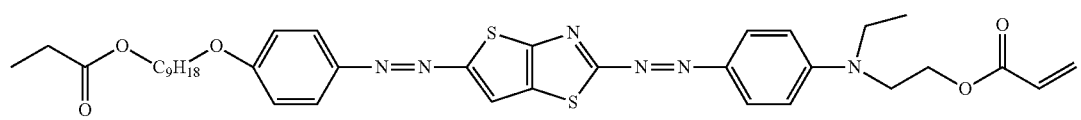

C6

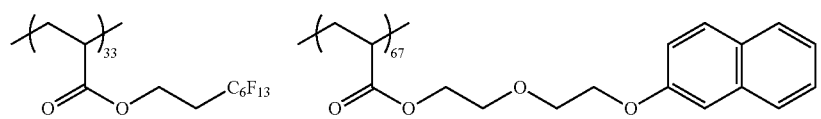

F1

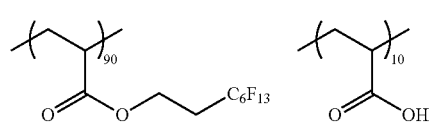

F2

The maximum absorption wavelengths of the first dichroic material and the second dichroic material are shown below.

Y1: 413 nm
Y2: 445 nm
Y3: 413 nm
Y4: 445 nm
Y5: 413 nm
Y6: 413 nm
Y7: 443 nm
Y8: 430 nm
M1: 502 nm
M2: 457 nm
M3: 442 nm
C1: 592 nm
C2: 592 nm
C3: 605 nm
C4: 592 nm
C5: 592 nm
C6: 592 nm

[Evaluation]

The following evaluations were performed on the polarizers of Examples and Comparative Examples obtained as described above.

[Degree of Alignment]

Each light absorption anisotropic film prepared in the examples and the comparative examples was set on the sample stand in a state in which a linear polarizer was inserted on a light source side of an optical microscope ("ECLIPSE E600 POE", manufactured by Nikon Corporation), the absorbances of the polarizer in wavelength ranges A to C described below were measured using a multi-channel spectrometer ("QE65000", manufactured by Ocean Optics, Inc.), and the degree of alignment in each wavelength range was calculated according to the following equation. The results are shown in Table 1 below.

Degree of alignment: $S=((Az0/Ay0)-1)/((Az0/Ay0)+2)$

Az0: Absorbance of dye film with respect to polarized light in absorption axis direction Ay0: Absorbance of dye film with respect to polarized light in polarization axis direction In the equation described above, "Az0" represents the absorbance of the light absorption anisotropic film with respect to the polarized light in the absorption axis direction, and "Ay0" represents the absorbance of the light absorption anisotropic film with respect to the polarized light in the polarization axis direction.

A: The degree of alignment in a range of 400 nm to 700 nm
B: The degree of alignment in a range of 400 nm to 500 nm
C: The degree of alignment in a range of 600 am to 700 nm

TABLE 1

| | Liquid crystal compound | | | First dichroic material | | | | | | | |
|---|---|---|---|---|---|---|---|---|---|---|---|
| | Type | Parts by mass | logP | Type | Parts by mass | logP | Compatible or incompatible | Type | Parts by mass | logP | Compatible or incompatible |
| Example 1 | L1 | 5.859 | 4.6 | Y1 | 0.293 | 9.4 | Compatible | — | — | — | — |
| Example 2 | L1 | 5.786 | 4.6 | Y2 | 0.434 | 10.2 | Compatible | — | — | — | — |
| Example 3 | L2 | 5.642 | 4.6 | Y3 | 0.506 | 10.4 | Compatible | — | — | — | — |
| Example 4 | L3 | 5.545 | 4.6 | Y1 | 0.601 | 9.4 | Compatible | — | — | — | — |
| Example 5 | L4 | 5.646 | 4.6 | Y3 | 0.565 | 10.4 | Compatible | — | — | — | — |
| Example 6 | L1 | 5.858 | 4.6 | Y5 | 0.293 | 10.7 | Compatible | — | — | — | — |
| Example 7 | L1 | 5.858 | 4.6 | Y6 | 0.293 | 12.4 | Compatible | — | — | — | — |
| Example 8 | L5 | 5.529 | 4.6 | Y1 | 0.346 | 9.4 | Compatible | M1 | 0.311 | 6.9 | Compatible |
| Example 9 | L5 | 5.529 | 4.6 | Y1 | 0.346 | 9.4 | Compatible | M2 | 0.311 | 8.4 | Compatible |
| Example 10 | L5 | 5.529 | 4.6 | Y1 | 0.346 | 9.4 | Compatible | M3 | 0.311 | 9.1 | Compatible |
| Example 11 | L2 | 5.786 | 4.6 | C5 | 0.651 | 8.7 | Compatible | — | — | — | — |
| Comparative Example 1 | L1 | 5.786 | 4.6 | — | — | — | — | — | — | — | — |

TABLE 1-continued

| | | | | | | | | | | | | Second dichroic material | | | | Interface modifier | | Chloroform | Degree of alignment | | |
|---|---|---|---|---|---|---|---|---|---|---|---|---|---|---|---|---|---|---|---|---|---|
| | | | | | | | | | | | | Type | Parts by mass | logP | Compatible or incompatible | Type | Parts by mass | Parts by mass | A | B | C |
| Comparative Example 2 | L3 | 5.900 | 4.6 | Y1 | 0.459 | 9.4 | Compatible | C5 | 0.590 | 8.7 | Compatible | | | | | | | | | | |
| Comparative Example 3 | L2 | 5.786 | 4.6 | Y8 | 0.506 | 6.8 | Compatible | C5 | 0.651 | 8.7 | Compatible | | | | | | | | | | |
| Reference Example 1 | L1 | 6.314 | 4.6 | — | — | — | — | — | — | — | — | | | | | | | | | | |
| Example 1 | | | | | | | | | | | | C1 | 0.792 | 10.4 | Incompatible | F1 | 0.056 | 93.000 | 0.952 | 0.945 | 0.957 |
| Example 2 | | | | | | | | | | | | C2 | 0.723 | 10.6 | Incompatible | F1 | 0.056 | 93.000 | 0.961 | 0.953 | 0.967 |
| Example 3 | | | | | | | | | | | | C3 | 0.796 | 13.0 | Incompatible | F1 | 0.056 | 93.000 | 0.953 | 0.950 | 0.957 |
| Example 4 | | | | | | | | | | | | C4 | 0.802 | 10.6 | Incompatible | F1 | 0.052 | 93.000 | 0.974 | 0.958 | 0.981 |
| Example 5 | | | | | | | | | | | | C4 | 0.726 | 10.6 | Incompatible | F1 | 0.063 | 93.000 | 0.969 | 0.955 | 0.977 |
| Example 6 | | | | | | | | | | | | C1 | 0.793 | 10.4 | Incompatible | F1 | 0.056 | 93.000 | 0.944 | 0.942 | 0.950 |
| Example 7 | | | | | | | | | | | | C1 | 0.793 | 10.4 | Incompatible | F1 | 0.056 | 93.000 | 0.936 | 0.931 | 0.945 |
| Example 8 | | | | | | | | | | | | C6 | 0.760 | 10.8 | Incompatible | F1 | 0.054 | 93.000 | 0.950 | 0.942 | 0.956 |
| Example 9 | | | | | | | | | | | | C6 | 0.760 | 10.8 | Incompatible | F1 | 0.054 | 93.000 | 0.941 | 0.936 | 0.953 |
| Example 10 | | | | | | | | | | | | C6 | 0.760 | 10.8 | Incompatible | F1 | 0.054 | 93.000 | 0.932 | 0.925 | 0.944 |
| Example 11 | | | | | | | | | | | | Y7 | 0.506 | 8.8 | Incompatible | F2 | 0.056 | 93.000 | 0.924 | 0.934 | 0.910 |
| Comparative Example 1 | | | | | | | | | | | | Y4 C1 | 0.506 0.651 | 13.9 10.4 | Incompatible Incompatible | F1 | 0.056 | 93.000 | 0.901 | 0.892 | 0.923 |
| Comparative Example 2 | | | | | | | | | | | | — | — | — | — | F1 | 0.051 | 93.000 | 0.910 | 0.930 | 0.901 |
| Comparative Example 3 | | | | | | | | | | | | — | — | — | — | F2 | 0.056 | 93.000 | 0.894 | 0.872 | 0.902 |
| Reference Example 1 | | | | | | | | | | | | C1 | 0.631 | 10.4 | Incompatible | F1 | 0.055 | 93.000 | 0.919 | 0.931 | 0.911 |

Based on the results listed in Table 1, it was found that a polarizer with a high degree of alignment was obtained by combining, as dichroic materials, the dichroic material (first dichroic material) compatible with the liquid crystal compound and the dichroic material (first dichroic material) compatible with the liquid crystal compound (Examples 1 to 11).

It can be said that the above-described results are unexpected effects considering that the degree of alignment in a case where two kinds of dichroic materials that were incompatible with the liquid crystal compound were blended (Comparative Example 1) and a case where two kinds of dichroic materials that were compatible with the liquid crystal compound were blended (Comparative Examples 2 and 3) was smaller than that of Reference Example 1 in which one kind of dichroic material that was incompatible with the liquid crystal compound was blended.

What is claimed is:

1. A polarizer which is formed of a polarizer-forming composition containing a liquid crystal compound, a first dichroic material, and a second dichroic material,
    wherein the first dichroic material and the second dichroic material are aligned horizontally with respect to a surface of the polarizer,
    wherein the first dichroic material and the second dichroic material are azo dyes,
    wherein the first dichroic material is a compound compatible with the liquid crystal compound, and
    wherein the second dichroic material is a compound which is not compatible with the liquid crystal compound.

2. The polarizer according to claim 1,
    wherein the second dichroic material is a dichroic azo dye represented by Formula (2), and
    a difference between a log P value of the second dichroic material and a log P value of the liquid crystal compound is 4.3 or greater,

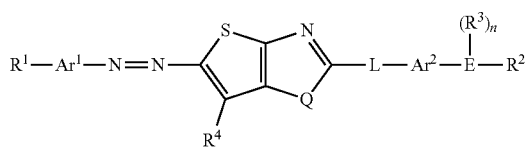

(2)

in Formula (2),
$R^1$ and $R^2$ represent a substituent, and $R^3$ and $R^4$ each independently represent a hydrogen atom or a substituent,
$Ar^1$ and $Ar^2$ each independently represent a divalent aromatic group which may have a substituent,
E represents a single bond or any of a nitrogen atom, an oxygen atom, or a sulfur atom,
Q represents an oxygen atom or a sulfur atom,
L represents a single bond, —N=N—, —CR=N—, —CR=CR'—, or —C(=O)—NR—, R and R' each independently represent a hydrogen atom, a halogen atom, a cyano group, a nitro group, or an alkyl group having 1 to 6 carbon atoms, and
n represents 0 or 1, where n represents 0 in a case where E represents a single bond or any of an oxygen atom or a sulfur atom, and n represents 1 in a case where E represents a nitrogen atom.

3. The polarizer according to claim 2,
    wherein any one of the first dichroic material or the second dichroic material is a dichroic material having a maximum absorption wavelength in a range of 380 nm or greater and less than 455 nm.

4. The polarizer according to claim 2, wherein any one of the first dichroic material or the second dichroic material is a dichroic material having a maximum absorption wavelength in a range of 560 nm or greater and less than 700 nm.

5. The polarizer according to claim 2, wherein the first dichroic material contains a dichroic material having a maximum absorption wavelength in a range of 380 nm or greater and less than 455 nm and a dichroic material having a maximum absorption wavelength in a range of 455 nm or greater and less than 560 nm.

6. An image display device comprising:
the polarizer according to claim 2.

7. The polarizer according to claim 1, wherein any one of the first dichroic material or the second dichroic material is a dichroic material having a maximum absorption wavelength in a range of 380 nm or greater and less than 455 nm.

8. The polarizer according to claim 7, wherein any one of the first dichroic material or the second dichroic material is a dichroic material having a maximum absorption wavelength in a range of 560 nm or greater and less than 700 nm.

9. The polarizer according to claim 7, wherein the first dichroic material contains a dichroic material having a maximum absorption wavelength in a range of 380 nm or greater and less than 455 nm and a dichroic material having a maximum absorption wavelength in a range of 455 nm or greater and less than 560 nm.

10. An image display device comprising:
the polarizer according to claim 7.

11. The polarizer according to claim 1, wherein any one of the first dichroic material or the second dichroic material is a dichroic material having a maximum absorption wavelength in a range of 560 nm or greater and less than 700 nm.

12. The polarizer according to claim 11, wherein the first dichroic material contains a dichroic material having a maximum absorption wavelength in a range of 380 nm or greater and less than 455 nm and a dichroic material having a maximum absorption wavelength in a range of 455 nm or greater and less than 560 nm.

13. An image display device comprising:
the polarizer according to claim 11.

14. The polarizer according to claim 1, wherein the first dichroic material contains a dichroic material having a maximum absorption wavelength in a range of 380 nm or greater and less than 455 nm and a dichroic material having a maximum absorption wavelength in a range of 455 nm or greater and less than 560 nm.

15. An image display device comprising:
the polarizer according to claim 14.

16. An image display device comprising:
the polarizer according to claim 1.

17. A laminate comprising a base material, an alignment film provided on the base material, and a polarizer on the alignment film,
wherein the alignment film is a rubbing treatment alignment film or a photo-alignment film, and
wherein the polarizer is the polarizer according to claim 1.

18. The polarizer according to claim 1, wherein the polarizer consists of one layer.

* * * * *